United States Patent
Ikeda et al.

(10) Patent No.: US 11,967,797 B2
(45) Date of Patent: Apr. 23, 2024

(54) PUNCTURE FORMING METHOD, SAMPLE SEPARATING METHOD, SEMICONDUCTOR ELEMENT MANUFACTURING METHOD, SEMICONDUCTOR LASER ELEMENT MANUFACTURING METHOD, AND SEMICONDUCTOR LASER ELEMENT

(71) Applicant: NUVOTON TECHNOLOGY CORPORATION JAPAN, Kyoto (JP)

(72) Inventors: Daisuke Ikeda, Okayama (JP); Hideo Kitagawa, Toyama (JP); Hiroshi Asaka, Toyama (JP); Masayuki Ono, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 873 days.

(21) Appl. No.: 17/061,936

(22) Filed: Oct. 2, 2020

(65) Prior Publication Data

US 2021/0016395 A1 Jan. 21, 2021

Related U.S. Application Data

(63) Continuation of application No. PCT/JP2019/006876, filed on Feb. 22, 2019.

(30) Foreign Application Priority Data

Apr. 5, 2018 (JP) .................. 2018-073502

(51) Int. Cl.
*H01S 5/00* (2006.01)
*H01S 5/02* (2006.01)
(Continued)

(52) U.S. Cl.
CPC .......... *H01S 5/0201* (2013.01); *H01S 5/0202* (2013.01); *B23K 26/0622* (2015.10);
(Continued)

(58) Field of Classification Search
CPC .. H01S 5/0201; H01S 5/0202; H01S 5/04256; H01S 5/22; H01S 5/32341
See application file for complete search history.

(56) References Cited

U.S. PATENT DOCUMENTS

| 6,580,054 B1 * | 6/2003 | Liu ........................ B23K 26/40 |
| | | 219/121.68 |
| 8,389,312 B2 * | 3/2013 | Yoshizumi ........ H01S 5/320275 |
| | | 438/33 |

(Continued)

FOREIGN PATENT DOCUMENTS

| JP | 2011-211244 A | 10/2011 |
| JP | 2011-249556 A | 12/2011 |

(Continued)

OTHER PUBLICATIONS

International Search Report and Written Opinion issued in International Patent Application No. PCT/JP2019/006876, dated May 21, 2019; with partial English translation.

(Continued)

*Primary Examiner* — Kinam Park
(74) *Attorney, Agent, or Firm* — Rimon P.C.

(57) ABSTRACT

A puncture forming method is a method of forming punctures in a sample by irradiating a surface of the sample with a light beam. The puncture forming method includes: forming a first puncture by irradiating a first position on the surface of the sample with a first pulse of the light beam; and after the forming of the first puncture, forming a second puncture which at least partially overlaps the first puncture by irradiating, with a second pulse of the light beam, a second position on the surface of the sample positioned away from the first position in a first direction. The second puncture has a tip which is positioned inside the sample and which is bent in a direction opposite to the first direction.

20 Claims, 19 Drawing Sheets

(51) Int. Cl.
| | |
|---|---|
| B23K 26/0622 | (2014.01) |
| B23K 26/082 | (2014.01) |
| B23K 26/359 | (2014.01) |
| B23K 26/386 | (2014.01) |
| B23K 103/00 | (2006.01) |
| H01S 5/042 | (2006.01) |
| H01S 5/22 | (2006.01) |
| H01S 5/323 | (2006.01) |

(52) U.S. Cl.
CPC .......... *B23K 26/082* (2015.10); *B23K 26/359* (2015.10); *B23K 26/386* (2013.01); *B23K 2103/56* (2018.08); *H01S 5/04256* (2019.08); *H01S 5/22* (2013.01); *H01S 5/32341* (2013.01)

(56) References Cited

U.S. PATENT DOCUMENTS

| | | | | |
|---|---|---|---|---|
| 2009/0039061 A1* | 2/2009 | Kondo | ................ | B23K 26/361 |
| | | | | 219/121.72 |
| 2010/0085996 A1* | 4/2010 | Matsuno | ............ | H01S 5/04256 |
| | | | | 438/42 |
| 2011/0128983 A1* | 6/2011 | Takagi | ................ | H01S 5/34333 |
| | | | | 438/33 |
| 2011/0292959 A1* | 12/2011 | Shimamoto | ........... | H01S 5/2201 |
| | | | | 438/33 |
| 2012/0211477 A1* | 8/2012 | Chacin | ................ | B23K 26/035 |
| | | | | 219/121.68 |
| 2013/0247615 A1 | 9/2013 | Boek et al. | | |
| 2016/0102009 A1 | 4/2016 | Boek et al. | | |
| 2020/0021083 A1* | 1/2020 | Ikeda | ................ | H01L 33/0075 |

FOREIGN PATENT DOCUMENTS

| | | |
|---|---|---|
| JP | 2012-050988 A | 3/2012 |
| JP | 2014-501686 A | 1/2014 |

OTHER PUBLICATIONS

Japanese Office Action dated Feb. 7, 2023 issued in the corresponding Japanese Patent Application No. 2020-511635.

* cited by examiner (a)

(b)

(a)

(b)

(a)

(b)

[WHEN CIRCULARLY POLARIZED LIGHT IS USED]

[WHEN LINEARLY POLARIZED LIGHT IS USED]

PUNCTURE FORMING METHOD, SAMPLE SEPARATING METHOD, SEMICONDUCTOR ELEMENT MANUFACTURING METHOD, SEMICONDUCTOR LASER ELEMENT MANUFACTURING METHOD, AND SEMICONDUCTOR LASER ELEMENT

CROSS REFERENCE TO RELATED APPLICATIONS

This application is a U.S. continuation application of PCT International Patent Application Number PCT/JP2019/006876 filed on Feb. 22, 2019, claiming the benefit of priority of Japanese Patent Application Number 2018-073502 filed on Apr. 5, 2018, the entire contents of which are hereby incorporated by reference.

BACKGROUND

1. Technical Field

The present disclosure relates to a puncture forming method, a sample separating method, a semiconductor element manufacturing method, a semiconductor laser element manufacturing method, and a semiconductor laser element, and more particularly, to a technique for forming punctures (recesses) in a sample, such as a semiconductor laser element substrate or a semiconductor element substrate, using a light beam.

2. Description of the Related Art

Recently, as a light source for a projector, a semiconductor light-emitting element, such as a semiconductor laser element or a light-emitting diode (LED) element, having features, such as high luminance, high definition, low power consumption and long life, has started to be used.

For example, the semiconductor laser element can be manufactured by separating a wafer (semiconductor laser element substrate) on which a semiconductor stack is formed. Specifically, the semiconductor laser element can be manufactured by cleaving the semiconductor laser element substrate to form bar-shaped substrates with resonator surfaces, and then separating each bar-shaped substrate into a plurality of individual pieces.

Conventionally, in order for separating a semiconductor laser element substrate, a technique has been proposed in which the semiconductor laser element substrate is separated by forming recesses called scribe trenches in the semiconductor laser element substrate and cutting the semiconductor laser element substrate along the scribe trenches (see, for example, Japanese Unexamined Patent Application Publication No. 2011-249556).

SUMMARY

The recesses for separating the semiconductor laser element substrate are formed by light beams, for example, laser beams. Specifically, when manufacturing semiconductor laser elements with waveguides, recesses are formed by laser beams between the waveguides of the semiconductor laser element substrate, and the semiconductor laser element substrate is separated by pressing a blade-shaped tool against the back surface of the semiconductor laser element substrate with one recess as a starting point.

However, the recesses formed by the conventional method provide poor flatness of the separated surface when the semiconductor laser element substrate is separated. As a result, the quality of a semiconductor laser element is also reduced.

The present disclosure has been conceived in order to solve such problems. An object of the present disclosure is to provide, for example, a puncture forming method which is capable of increasing the flatness of the separated surface when a sample, such as a semiconductor laser element substrate or a semiconductor element substrate, is separated.

In order to achieve the above object, one aspect of a puncture forming method according to the present disclosure is a puncture forming method of forming a puncture in a sample by irradiating a surface of the sample with a light beam. The puncture forming method includes: forming a first puncture by irradiating a first position on the surface of the sample with a first pulse of the light beam; and forming a second puncture by irradiating a second position on the surface of the sample with a second pulse of the light beam after the forming of the first puncture, the second puncture at least partially overlapping the first puncture, the second position being positioned away from the first position in a first direction. The second puncture includes a tip positioned inside the sample. The tip is bent in a direction opposite to the first direction.

Moreover, one aspect of a semiconductor element manufacturing method according to the present disclosure is a semiconductor element manufacturing method of manufacturing a semiconductor element by separating a semiconductor element substrate. The semiconductor element manufacturing method includes: forming a first puncture by irradiating a first position on a surface of the semiconductor element substrate with a first pulse of a light beam; forming a second puncture by irradiating a second position on the surface of semiconductor element substrate with a second pulse of the light beam after the forming of the first puncture, the second puncture at least partially overlapping the first puncture, the second position being positioned away from the first position in a first direction; and separating the semiconductor element substrate along a recess after the forming of the second puncture, the recess being formed by the first puncture and the second puncture. The second puncture includes a tip positioned inside the semiconductor element substrate. The tip is bent in a direction opposite to the first direction.

Moreover, one aspect of a sample separating method according to the present disclosure is a sample separating method of separating a sample. The sample separating method includes: forming a recess in the sample; and separating the sample along the recess. The recess includes a first region and a second region, the first region having a line shape along a first direction in a plan view of the sample and having a planar shape in a vertical cross-sectional view of the sample, the planar shape spreading to a plane defined by the first direction and a second direction which is a depth direction of the sample, the second region having a line shape extending from the first region in a direction opposite to the first direction.

Moreover, an aspect of another semiconductor element manufacturing method according to the present disclosure is a semiconductor element manufacturing method of manufacturing a semiconductor element by separating a semiconductor element substrate. The semiconductor element manufacturing method includes: forming a recess in the semiconductor element substrate; and separating the semiconductor element substrate along the recess. The recess includes a first region and a second region, the first region having a line shape along a first direction in a plan view of the semiconductor element substrate and having a planar shape in a vertical cross-sectional view of the semiconductor element substrate, the planar shape spreading to a plane defined by the first direction and a second direction which is a depth direction of the semiconductor element substrate, the second region having a line shape extending from the first region in a direction opposite to the first direction.

Moreover, one aspect of a semiconductor laser element manufacturing method according to the present disclosure is a semiconductor laser element manufacturing method of manufacturing a semiconductor laser element by separating a semiconductor laser element substrate. The semiconductor laser element manufacturing method includes: forming a recess in the semiconductor laser element substrate; and separating the semiconductor laser element substrate along the recess. The recess includes a first region and a second region, the first region having a line shape along a first direction in a plan view of the semiconductor laser element substrate and having a planar shape in a vertical cross-sectional view of the semiconductor laser element substrate, the planar shape spreading to a plane defined by the first direction and a second direction which is a depth direction of the semiconductor laser element substrate, the second region having a line shape extending from the first region in a direction opposite to the first direction.

Moreover, one aspect of a semiconductor laser element according to the present disclosure is a semiconductor laser element including: a step on at least one side surface of the semiconductor laser element. The step includes a first region and a second region, the first region having a planar shape which spreads to a plane defined by a first direction along a surface of the semiconductor laser element and a second direction which is a depth direction of the semiconductor laser element, the second region having a line shape extending from the first region in a direction opposite to the first direction.

According to the present disclosure, it is possible to increase the flatness of the separated surface when a sample, such as a semiconductor laser element substrate or a semiconductor element substrate, is separated.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

Figure 1:
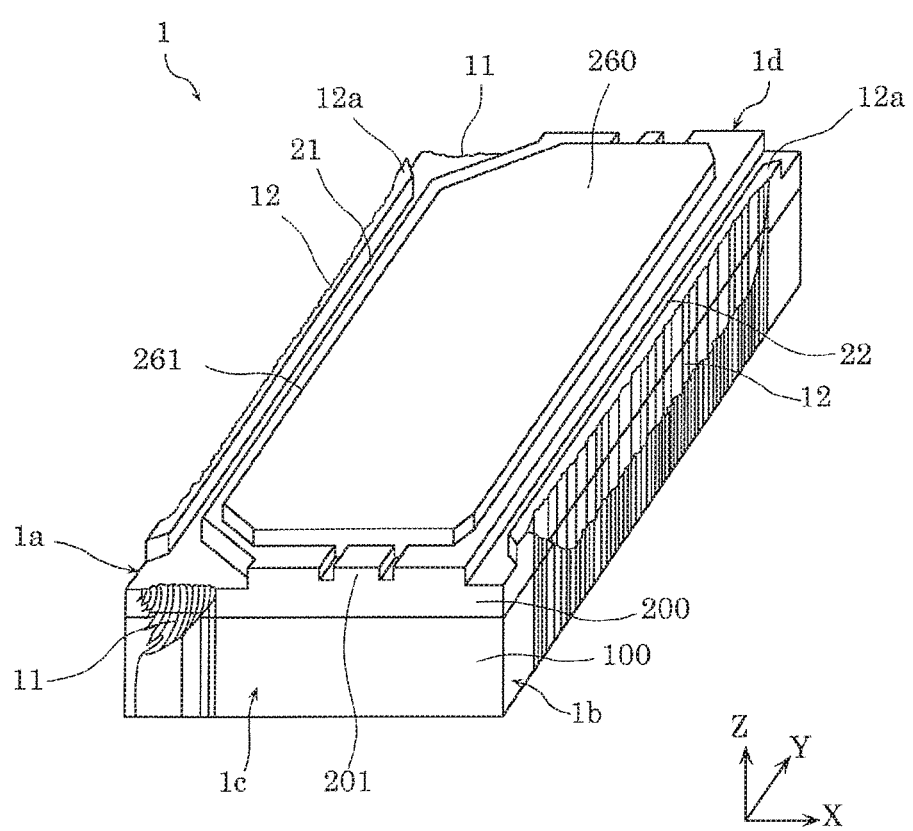
FIG. 1 is a perspective view of a semiconductor laser element according to an embodiment.

Hereinafter, an embodiment of the present disclosure will be described with reference to the drawings. Note that the embodiment described below shows a specific example of the present disclosure. Therefore, the numerical values, shapes, materials, structural elements, arrangement positions and connection forms of the structural elements, steps (processes), order of steps, and the like shown in the following embodiment are merely examples, and do not intend to limit the present disclosure. Accordingly, among the structural elements in the following embodiment, structural elements that are not described in the independent claims indicating the highest concept of the present disclosure are described as arbitrary structural elements.

Note that the drawings are represented schematically and are not necessarily precise illustrations. As such, the scaling, etc., depicted in the drawings is not necessarily accurate. Additionally, like reference signs indicate like elements in the drawings, and overlapping descriptions thereof are omitted or simplified.

In the Specification and Drawings, the X-axis, the Y-axis, and the Z-axis represent the three axes in the three-dimensional orthogonal coordinate system. In the present embodiment, the Z-axis direction is a vertical direction, and the direction perpendicular to the Z-axis (direction parallel to the XY-plane) is a horizontal direction. The X-axis and the Y-axis are orthogonal to each other, and are orthogonal to the Z-axis. The X-axis direction and the Y-axis direction are directions in the substrate plane of substrate 100. In other words, the XY-plane is a plane parallel to the principle surface of substrate 100. In addition, the laser resonator length direction of semiconductor laser element 1 is the Y-axis direction. Note that the directions in which the arrows of the X-axis, the Y-axis, and the Z-axis are directed are positive directions.

EMBODIMENT

[Semiconductor Laser Element]

Figure 2:
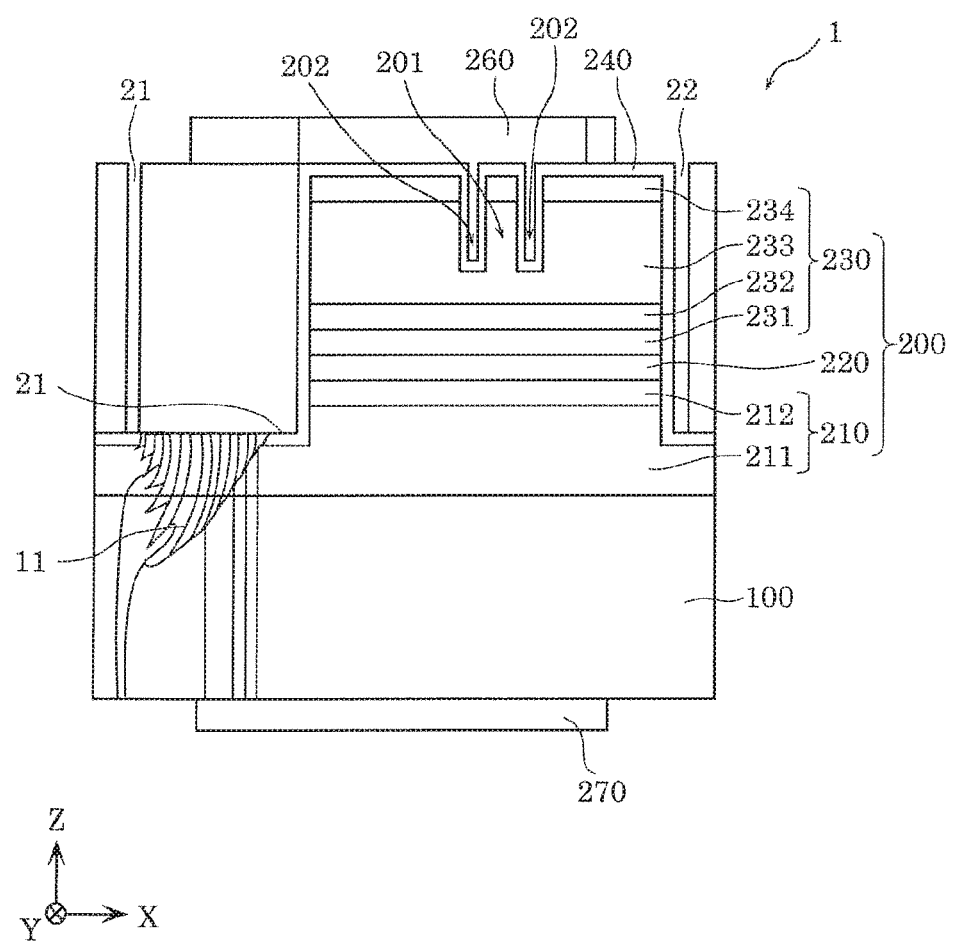
FIG. 2 is a front view of the semiconductor laser element according to the embodiment.
Figure 3:
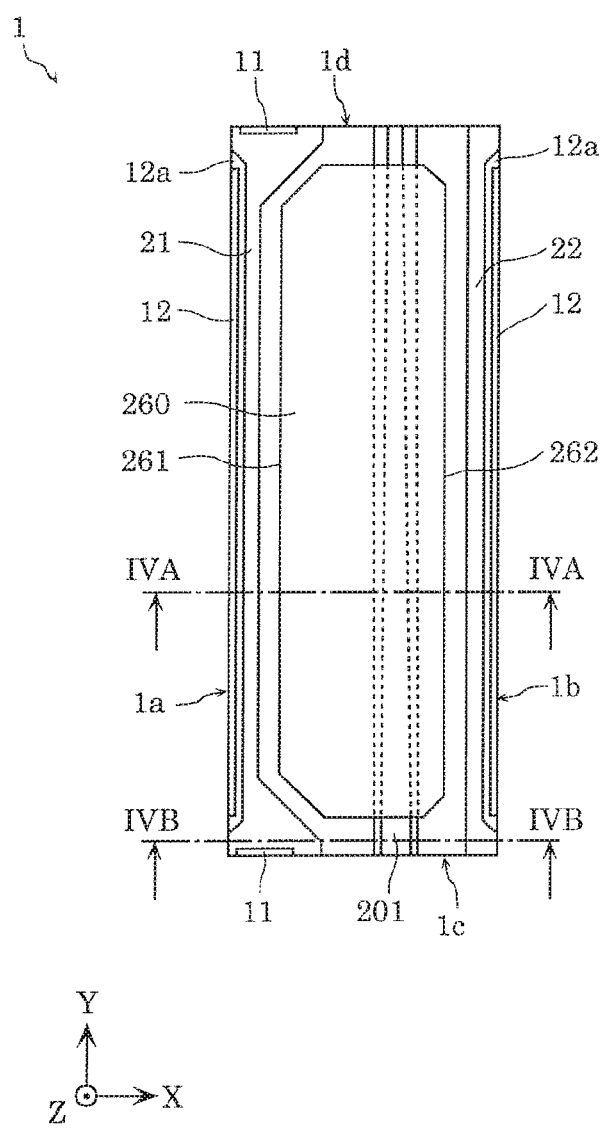
FIG. 3 is a top view of the semiconductor laser element according to the embodiment.
Figure 4A:
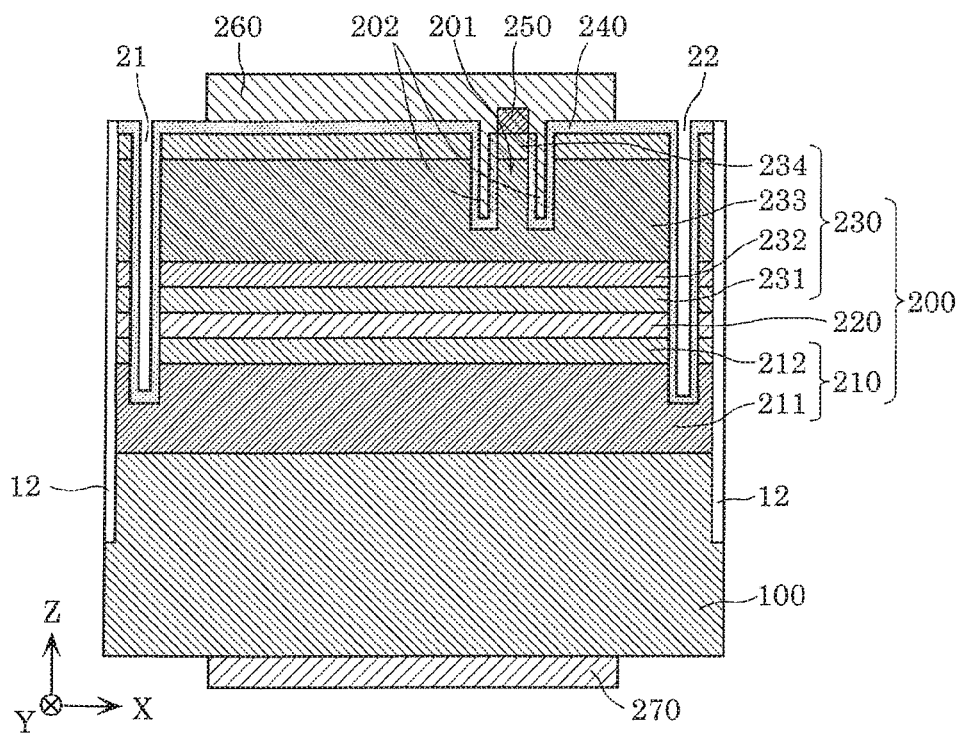
FIG. 4A is a cross-sectional view of the semiconductor laser element according to the embodiment taken along line IVA-IVA of FIG. 3.
Figure 4B:
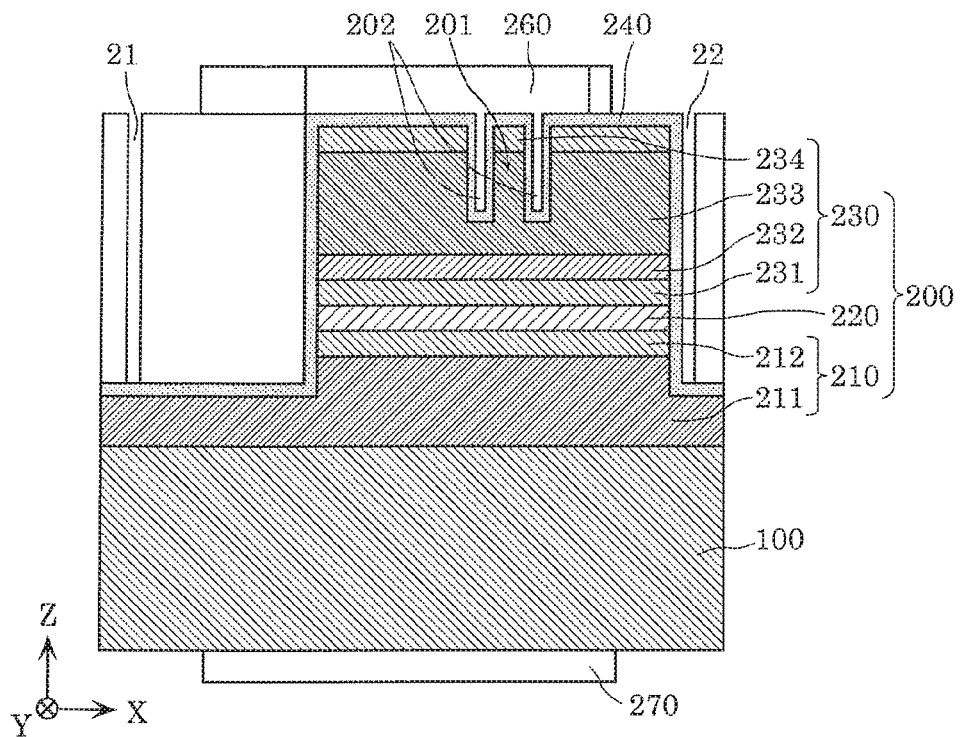
FIG. 4B is a cross-sectional view of the semiconductor laser element according to the embodiment taken along line IVB-IVB of FIG. 3.

First, a configuration of semiconductor laser element 1 manufactured by a method of manufacturing semiconductor laser element 1 according to the present embodiment will be described with reference to FIG. 1 to FIG. 4B. FIG. 1 to FIG. 3 are a perspective view, a front view, and a top view of semiconductor laser element 1 according to the present embodiment, respectively. FIGS. 4A and 4B are cross-sectional views of semiconductor laser element 1 taken along lines IVA-IVA and IVB-IVB in FIG. 3, respectively.

As illustrated in FIG. 1 and FIG. 2, semiconductor laser element 1 includes first side surface 1a, second side surface 1b, third side surface 1c of (1-100) plane, and fourth side surface 1d of (~1100) plane.

First side surface 1a and second side surface 1b are substantially parallel to the Y-axis. Specifically, first side surface 1a and second side surface 1b are substantially parallel to the YZ plane. Second side surface 1b opposes first side surface 1a.

Although the details will be described later, first side surface 1a and second side surface 1b are separated surfaces along the lengthwise separation lines extending in the Y-axis direction when a semiconductor laser element substrate is separated to manufacture semiconductor laser element 1.

Third side surface 1c and fourth side surface 1d are substantially parallel to the X-axis. Specifically, third side surface 1c and fourth side surface 1d are substantially parallel to the XZ plane, and are substantially perpendicular to first side surface 1a and second side surface 1b. Fourth side surface 1d opposes third side surface 1c. Third side surface 1c and fourth side surface 1d are resonator surfaces of semiconductor laser element 1. Specifically, third side surface 1e is a front end surface of semiconductor laser element 1, and fourth side surface 1d is a rear end surface of semiconductor laser element 1. Third side surface 1c, which is the front end surface, is an emission surface from which light is extracted from semiconductor laser element 1, and fourth side surface 1d, which is the rear end surface, is a reflective surface which opposes the emission surface.

Although the details will be described later, third side surface 1c and fourth side surface 1d are separated surfaces along the crosswise separation lines extending in the X-axis direction when a semiconductor laser element substrate is separated to manufacture semiconductor laser element 1. Specifically, third side surface 1c and fourth side surface 1d are surfaces which are in contact with waveguide 201, and are cleavage planes. Although not illustrated in FIG. 1 to FIG. 3, third side surface 1c and fourth side surface 1d are covered with end surface coating films (reflective films).

As illustrated in FIG. 1 to FIG. 4B, semiconductor laser element 1 includes substrate 100 and semiconductor element structure 200 positioned on one of the surfaces of substrate 100. Semiconductor laser element 1 according to the present embodiment is a nitride semiconductor laser made of a nitride-based semiconductor material. Hence, a nitride semiconductor substrate is used as substrate 100. Semiconductor element structure 200 is a nitride semiconductor layer stack in which a plurality of nitride semiconductor layers are stacked.

Substrate 100 is, for example, a GaN substrate made of GaN. In the present embodiment, an n-type GaN substrate having a hexagonal crystal (0001) Ga plane as a surface is used as substrate 100.

As illustrated in FIG. 4A and FIG. 4B, semiconductor element structure 200 sequentially includes, on substrate 100, first semiconductor layer 210 of a first conductivity type, active layer 220, and second semiconductor layer 230 of a second conductivity type different from the first conductivity type. Each of first semiconductor layer 210, active layer 220, and second semiconductor layer 230 is a nitride semiconductor layer, and is configured as below as an example.

First semiconductor layer 210 includes, for example, n-type clad layer 211 made of n-type AlGaN, and n-side guide layer 212 formed on n-type clad layer 211 and made of GaN.

Active layer 220 is an undoped quantum well active layer, and is, for example, an active layer having a quantum well structure in which a quantum well layer made of InGaN and a quantum barrier layer made of InGaN are alternately stacked.

Second semiconductor layer 230 includes, for example, p-side guide layer 231 made of InGaN, p-type electron barrier layer (overflow controlling layer) 232 formed on p-side guide layer 231, p-type clad layer 233 formed on p-type electron barrier layer 232 and made of p-type AlGaN, and p-type contact layer 234 formed on p-type clad layer 233 and made of p-type GaN.

As illustrated in FIG. 3, semiconductor laser element 1 includes waveguide 201 extending in the laser resonator length direction (Y-axis direction). Waveguide 201 functions as an electric current injection region and an optical waveguide in semiconductor laser element 1. As illustrated in FIG. 4A and FIG. 4B, waveguide 201 is formed in second semiconductor layer 230. In the present embodiment, waveguide 201 has a ridge stripe structure formed in a ridge shape.

Specifically, waveguide 201 is formed by digging, in second semiconductor layer 230, two openings 202 extending in the laser resonator length direction. In other words, waveguide 201 is sandwiched between two openings 202 formed in second semiconductor layer 230. In the present embodiment, waveguide 201 is formed by digging p-type clad layer 233 and p-type contact layer 234.

As illustrated in FIG. 4A and FIG. 4B, electric current blocking layer 240 made of $SiO_2$ covers second semiconductor layer 230 (in the present embodiment, p-type contact layer 234), except for the portion over waveguide 201, from above. In other words, electric current blocking layer 240 includes an opening on p-type contact layer 234.

P-side ohmic electrode 250 and p-side electrode 260 are formed as first electrodes on semiconductor element structure 200. P-side ohmic electrode 250 is formed in the opening of electric current blocking layer 240. P-side electrode 260 is formed over p-side ohmic electrode 250. P-side ohmic electrode 250 is made of, for example, Pd and Pt, and p-side electrode 260 is made of, for example, Ti, Pt, and Au.

Moreover, n-side electrode 270 is formed as a second electrode on the other surface of substrate 100, which is the surface opposite to the one surface of substrate 100 (the surface on p-side electrode 260 side). N-side electrode 270 is made of, for example, Ti, Pt, and Au. Note that p-side electrode 260 and n-side electrode 270 are not formed at the positions in the cross-section taken along IVB-IVB (FIG. 4B) of semiconductor laser element 1 illustrated in FIG. 3. Both p-side electrode 260 and n-side electrode 270 are positioned away from third side surface 1c and fourth side surface 1d by a predetermined distance.

In semiconductor laser element 1 according to the present embodiment, waveguide 201 is positioned offset in the width direction of semiconductor laser element 1 as illustrated in FIG. 2. In other words, waveguide 201 is positioned offset in the X-axis direction (first direction), and the center line of waveguide 201 is positioned off center of semiconductor laser element 1 in the width direction.

In the present embodiment, waveguide 201 is positioned offset in the positive X-axis direction (right direction) when semiconductor laser element 1 is viewed from the front (front end surface). For this reason, as illustrated in FIG. 3, a first width which is from first end 261 of p-side electrode 260 closest to first side surface 1a to waveguide 201 is greater than a second width which is from second end 262 of p-side electrode 260 closest to second side surface 1b to waveguide 201.

The width of one end of waveguide 201 in the resonator length direction (the ridge end on the front end side of semiconductor laser element 1) is different from the width of the other end of waveguide 201 (the ridge end on the rear end side of semiconductor laser element 1). Specifically, the width of waveguide 201 on third side surface 1c (the front end surface) is greater than the width of waveguide 201 on fourth side surface 1d (the rear end surface). In other words, in semiconductor laser element 1, a portion where waveguide 201 has a greater width is used as the front end surface for laser light extraction.

Semiconductor laser element 1 includes a plurality of recesses and trenches. Specifically, as illustrated in FIG. 1 to FIG. 4B, semiconductor laser element 1 includes first recesses 11, second recesses 12, first trench 21 and second trench 22.

As will be described later, each of first recesses 11 is a separation trench for cleavage, and each of second recesses 12 is a separation trench for isolation when semiconductor laser element 1 is separated into individual pieces. First recesses 11 and second recesses 12 are formed by laser beams.

First trench 21 and second trench 22 are guide trenches for forming separation trench forming regions 12a for forming second recesses 12. First trench 21 and second trench 22 are formed by etching.

As illustrated in FIG. 1 and FIG. 3, each first recess 11 extends in a line shape in the X-axis direction (first direction) in the vicinity of the intersection of first side surface 1a and third side surface 1c in a plan view. In the present embodiment, first recess 11 is formed in third side surface 1c. Specifically, first recess 11 of separated semiconductor laser element 1 is a step, and is formed so as to be depressed slightly backward from third side surface 1c (front end surface) in a top view. Here, for example, first recess 11 is positioned as far as possible from waveguide 201. In the case where the position of waveguide 201 is offset, for example, first recess 11 is formed on the opposite side to the offset direction of waveguide 201. Hence, as illustrated in FIG. 1 and FIG. 3, first recess 11 is formed in the negative X-axis direction.

First recess 11 is formed by being dug in the Z-axis direction from the bottom surface of first trench 21. First recess 11 penetrates semiconductor element structure 200, and reaches substrate 100. The detailed shape and forming method of first recess 11 will be described later. First recess 11 is also formed in fourth side surface 1d.

Second recess 12 is formed in each of first side surface 1a and second side surface 1b, as illustrated in FIG. 1 and FIG. 3. In the present embodiment, second recesses 12 are steps, and are formed so as to be depressed slightly backward from first side surface 1a and second side surface 1b in a top view.

Moreover, as illustrated in FIG. 1 and FIG. 4A, second recesses 12 are formed by being dug in the Z-axis direction from the upper surface of semiconductor element structure 200. Each of second recesses 12 penetrates semiconductor element structure 200 and reaches substrate 100. Second recess 12 is deeper than first trench 21 and second trench 22. In other words, the bottom of each second recess 12 is positioned deeper than the bottoms of first trench 21 and second trench 22. Although second recess 12 has a substantially trapezoid shape in a side view, the present disclosure is not limited to such an example.

In the present embodiment, each second recess 12 is formed in separation trench forming region 12a. Each separation trench forming region 12a is an island-shaped region obtained by forming first trench 21 and second trench 22, and extends in the Y-axis direction. Second recess 12 is formed by being dug in the Z-axis direction from the upper surface of separation trench forming region 12a.

As illustrated in FIG. 1 to FIG. 3, first trench 21 and second trench 22 extend substantially parallel to the Y-axis. First trench 21 and second trench 22 are formed as a pair across waveguide 201. In other words, waveguide 201 is positioned between a pair of first trench 21 and second trench 22 adjacent to each other. As illustrated in FIG. 4A, each of first trench 21 and second trench 22 has a recessed shape formed by the bottom surface and two opposing side surfaces which are substantially perpendicular to the bottom surface.

First trench 21 and second trench 22 are formed by digging semiconductor element structure 200. Specifically, first trench 21 and second trench 22 reach first semiconductor layer 210, and are dug such that the bottoms of first trench 21 and second trench 22 reach first semiconductor layer 210. In other words, first trench 21 and second trench 22 are formed by digging second semiconductor layer 230, active layer 220, and part of first semiconductor layer 210. In the present embodiment, digging extends halfway in n-type clad layer 211 so that first trench 21 and second trench 22 are formed. In other words, the bottoms of first trench 21 and second trench 22 reach n-type clad layer 211. Although the depth of first trench 21 is the same as the depth of second trench 22, the present disclosure is not limited to such an example.

[Method of Manufacturing Semiconductor Laser Element]

Figure 5A:
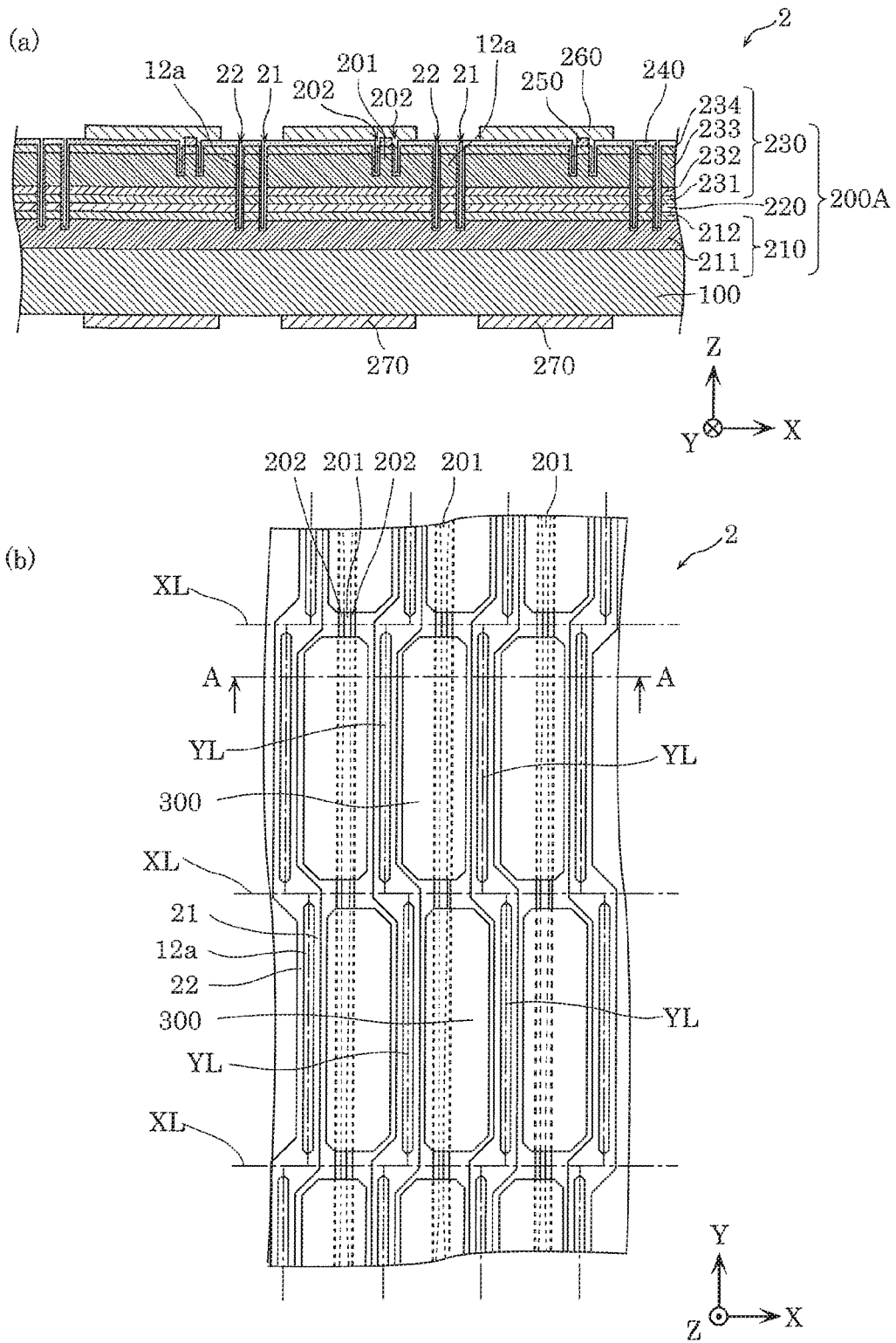
FIG. 5A illustrates a process for manufacturing a semiconductor laser element substrate, on which a semiconductor layer stack with a plurality of waveguides are formed, in a method of manufacturing the semiconductor laser element according to the embodiment.
Figure 5B:
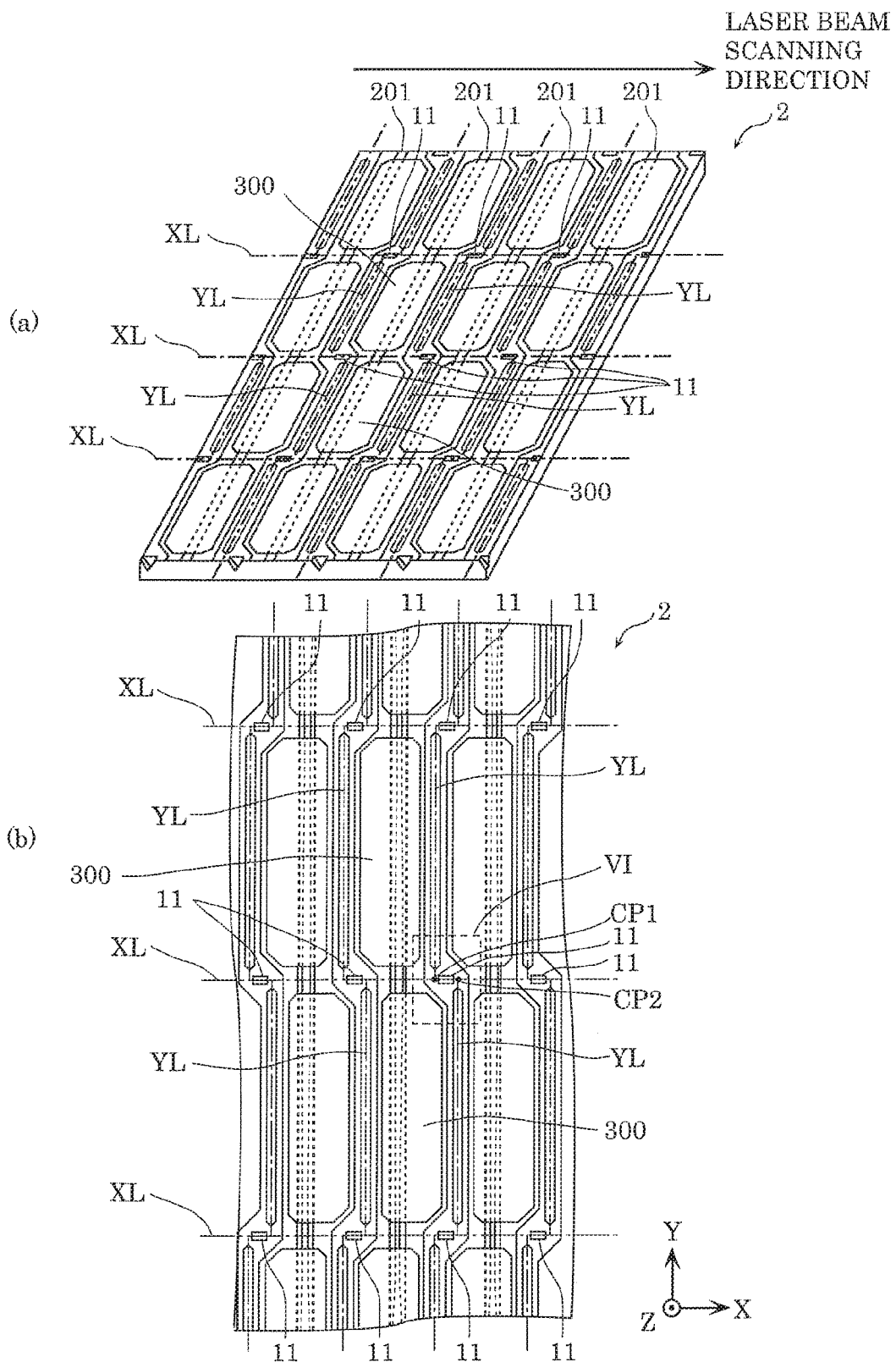
FIG. 5B illustrates a process for forming first recesses in the method of manufacturing the semiconductor laser element according to the embodiment.

Next, a method of manufacturing semiconductor laser element 1 according to the present embodiment will be described with reference to FIG. 5A to FIG. 5F. FIG. 5A to FIG. 5F illustrate the method of manufacturing semiconductor laser element 1 according to the present embodiment. In FIG. 5A, (a) at the top is a cross-sectional view taken along line A-A in (b) at the bottom, and (b) at the bottom is a partial plan view. In FIG. 5B, (a) at the top is a partial perspective view, and (b) at the bottom is a partial plan view. FIG. 5C to FIG. 5F are partial perspective views.

In the method of manufacturing semiconductor laser element 1 according to the present embodiment, first, as illustrated in FIG. 5A, semiconductor laser element substrate 2 is manufactured as a semiconductor layer stacked substrate including semiconductor layer stack 200A with a plurality of waveguides 201. Subsequently, as illustrated in FIG. 5B to FIG. 5F, semiconductor laser element 1 is obtained by separating, into a plurality of individual pieces, semiconductor laser element substrate 2 along two separation lines, crosswise separation lines XL and lengthwise separation lines YL, which are substantially orthogonal to each other. Hereinafter, specific steps will be described in detail.

First, as illustrated in (a) of FIG. 5A, semiconductor laser element substrate 2 is manufactured by forming, on substrate 100, semiconductor layer stack 200A including a plurality of waveguides 201.

Specifically, first, an n-type hexagonal crystal GaN substrate is prepared as substrate 100. Then, first semiconductor layer 210 is formed on substrate 100 by sequentially growing, n-type clad layer 211 made of Si-doped n-type AlGaN and n-side guide layer 212 made of n-type GaN.

Subsequently, for example, a quantum well active layer, in which a well layer made of undoped InGaN and a barrier layer made of undoped InGaN are alternately stacked once or more than once, is formed on first semiconductor layer 210 (in the present embodiment, on n-side guide layer 212) as active layer 220.

Subsequently, second semiconductor layer 230 is formed by sequentially forming, on active layer 220, p-side guide layer 231 made of InGaN, p-type electron barrier layer 232, p-type clad layer 233 made of Mg-doped p-type AlGaN, and p-type contact layer 234 made of p-type GaN. Accordingly, semiconductor layer stack 200A can be formed.

Next, first trenches 21 and second trenches 22 are formed as guide trenches along lengthwise separation lines YL in semiconductor laser element substrate 2 including semiconductor layer stack 200A. First trenches 21 and second trenches 22 are trenches for forming island-shaped separation trench forming regions 12a. Hence, each first trench 21 and each second trench 22 are connected to each other in the longitudinal direction. In other words, island-shaped separation trench forming regions 12a are formed by forming first trenches 21 and second trenches 22. First trenches 21 and second trenches 22 can be formed by etching.

Next, a plurality of waveguides 201 in the form of ridge stripes are formed in semiconductor layer stack 200A of semiconductor laser element substrate 2 so as to extend in the Y-axis direction. Waveguides 201 can be formed by etching. Waveguides 201 are formed at given and regular intervals in the X-axis direction. Lengthwise separation lines YL are misaligned along the X-axis in each row, but waveguides 201 are not misaligned in each row of lengthwise separation lines YL.

Next, electric current blocking layer 240 is formed so as to cover semiconductor layer stack 200A. For example, electric current blocking layer 240 including a $SiO_2$ film having a thickness of about 300 nm is formed on semiconductor layer stack 200A across the entire upper surface of substrate 100 by using a plasma chemical vapor deposition (CVD) method. As a result, the upper surface of p-type contact layer 234 is covered with electric current blocking layer 240, and the inner surfaces of first trenches 21, second trenches 22, and openings 202 are covered with electric current blocking layer 240.

Next, p-side ohmic electrode 250 and p-side electrode 260 corresponding to each element forming region 300 are formed on semiconductor layer stack 200A. Specifically, electric current blocking layer 240 above waveguide 201 in the form of ridge stripes is etched to form an opening in the form of stripes in electric current blocking layer 240. Subsequently, a Pt film and a Pd film are sequentially stacked on p-type contact layer 234 at waveguide 201 in the form of ridge stripes to form p-side ohmic electrode 250. Subsequently, p-side electrode 260 is formed by sequentially stacking a Ti film and an Au film so as to cover the opening of electric current blocking layer 240.

After p-side ohmic electrodes 250 and p-side electrodes 260 are formed, the surface of substrate 100 (the back surface of substrate 100) opposite to the surface on p-side electrode 260 side is polished, and n-side electrodes 270 are formed on the back surface of substrate 100. Specifically, n-side electrodes 270 having a stacked structure are formed by sequentially stacking a Ti film, a Pt film, and an Au film on the back surface of substrate 100.

In the manner described above, semiconductor laser element substrate 2 including, on substrate 100, semiconductor layer stack 200A with waveguides 201 extending in the Y-axis direction can be manufactured.

As illustrated in (b) of FIG. 5A, semiconductor laser element substrate 2 includes a plurality of element forming regions 300 each corresponding to finally separated semiconductor laser element 1. Element forming regions 300 are partitioned by crosswise separation lines XL and lengthwise separation lines YL. Specifically, each of element forming regions 300 is a region surrounded by two crosswise separation lines XL adjacent to each other in the Y-axis direction and two lengthwise separation lines YL adjacent to each other in the X-axis direction.

In (b) of FIG. 5A, each of crosswise separation lines XL is a first direction separation line parallel to the X-axis in the plane of substrate 100. In contrast, each of lengthwise separation lines YL is a second direction separation line parallel to the Y-axis in the plane of substrate 100. Crosswise separation lines XL and lengthwise separation lines YL are separation lines for separating semiconductor laser element substrate 2. In other words, semiconductor laser element substrate 2 is cut along crosswise separation lines XL and lengthwise separation lines YL, so that element forming regions 300 are separated into individual pieces each of which becomes semiconductor laser element 1.

In the present embodiment, element forming regions 300 are misaligned along the X-axis in each row. Specifically, element forming regions 300 are misaligned along the X-axis in each row, on a different side between an even row and an odd row. In other words, lengthwise separation lines YL are misaligned along the X-axis in each row of element forming regions 300.

Next, a method of obtaining semiconductor laser element 1 by separating semiconductor laser element substrate 2 into individual pieces will be described with reference to FIG. 5B to FIG. 5F.

As illustrated in FIG. 5A, after manufacturing semiconductor laser element substrate 2 including semiconductor layer stack 200A with waveguides 201, as illustrated in (a) and (b) of FIG. 5B, a plurality of first recesses 11 are formed along crosswise separation lines XL. Each of first recesses 11 is a separation trench for cleavage which serves as a starting point of cleavage when cleaving and separating semiconductor laser element substrate 2. In the present embodiment, each first recess 11 is a laser scribe trench formed by a laser scribe method. Details of the method of forming first recesses 11 will be described later.

In the present embodiment, first recess 11 is formed in the vicinity of each intersection between crosswise separation line XL and lengthwise separation line YL in the plane of substrate 100. Each of first recesses 11 is elongated along the X-axis. In other words, a plurality of first recesses 11 are formed along crosswise separation lines XL. First recesses 11 can be formed, for example, by scanning a laser beam in the positive X-axis direction.

Figure 6:
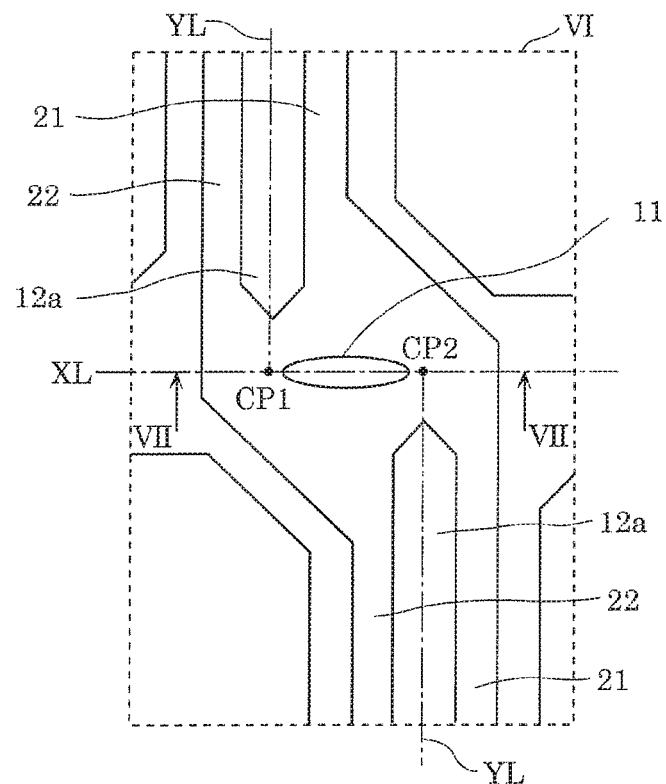
FIG. 6 is an enlarged view of region VI surrounded by dashed lines in (b) of FIG. 5B.

As illustrated in FIG. 6, first recess 11 is formed between two intersections CP1 and CP2 of two lengthwise separation lines YL adjacent to each other in the X-axis direction and one crosswise separation line XL. FIG. 6 is an enlarged view of region VI surrounded by dashed lines in (b) of FIG. 5B.

Figure 7:
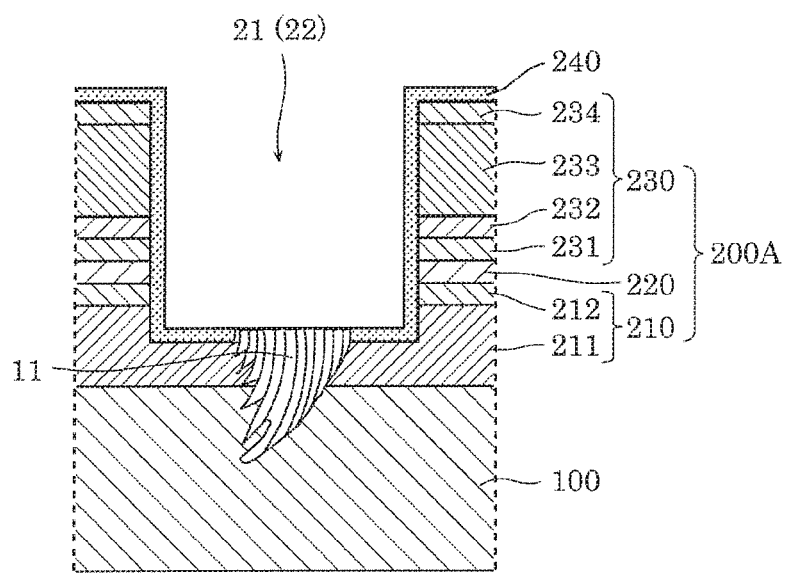
FIG. 7 is a cross-sectional view taken along a second crosswise separation line in (b) of FIG. 5B.

FIG. 7 is a cross-sectional view taken along line VII-VII in FIG. 6. As illustrated in FIG. 7, first recess 11 is formed at a joint portion of first trench 21 and second trench 22. In other words, first recess 11 is dug downward from the bottom surface of the joint portion of first trench 21 and second trench 22. Accordingly, the bottom of first recess 11 is positioned deeper than the bottoms of first trench 21 and second trench 22.

Figure 5C:
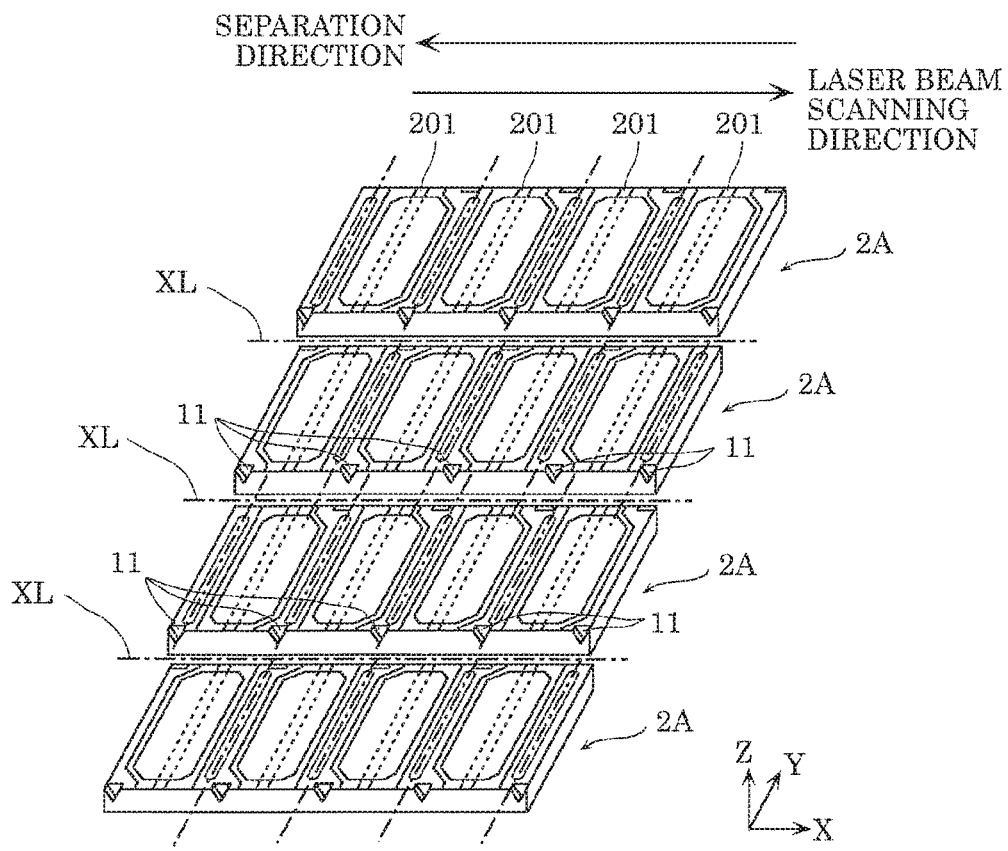
FIG. 5C illustrates a process for separating the semiconductor laser element substrate in the method of manufacturing the semiconductor laser element according to the embodiment.

Next, as illustrated in FIG. 5C, waveguides 201 are cut by separating semiconductor laser element substrate 2 along first recesses 11, so that a plurality of bar-shaped substrates 2A are manufactured. In the present embodiment, one semiconductor laser element substrate 2 is separated into bar-shaped substrates 2A by cleaving semiconductor laser element substrate 2 along first recesses 11 formed intermittently along crosswise separation lines XL.

Specifically, load is applied to semiconductor laser element substrate 2 with first recesses 11, by pressing a blade-shaped tool extending in the X-axis direction against the back surface (surface on n-side electrode 270 side) of semiconductor laser element substrate 2 along first recesses 11. As a result, semiconductor laser element substrate 2 cracks along the alignment direction (scribe direction) of first recesses 11 with one first recess 11 as a starting point, and semiconductor laser element substrate 2 is separated by cleavage of semiconductor laser element substrate 2 along the alignment direction of first recesses 11. In other words, semiconductor laser element substrate 2 is separated along crosswise separation line XL.

At this time, semiconductor laser element substrate 2 is separated in each row of first recesses 11 formed intermittently along the X-axis direction. Accordingly, a plurality of bar-shaped substrates 2A are obtained from one semiconductor laser element substrate 2. In the present embodiment, the separating direction of semiconductor laser element substrate 2 (the crack advancing direction) is opposite to the scanning direction of the laser beam. In other words, when semiconductor laser element substrate 2 is separated, the crack advances in the negative X-axis direction.

Moreover, in the present embodiment, lengthwise separation lines YL are misaligned along the X-axis in each row, on a different side between an even row and an odd row. Accordingly, among bar-shaped substrates 2A separated from semiconductor laser element substrate 2, the positions of lengthwise separation lines YL of two bar-shaped substrates 2A which are adjacent to each other in the Y-axis direction are such that one is misaligned along the X-axis relative to the other.

Figure 5D:
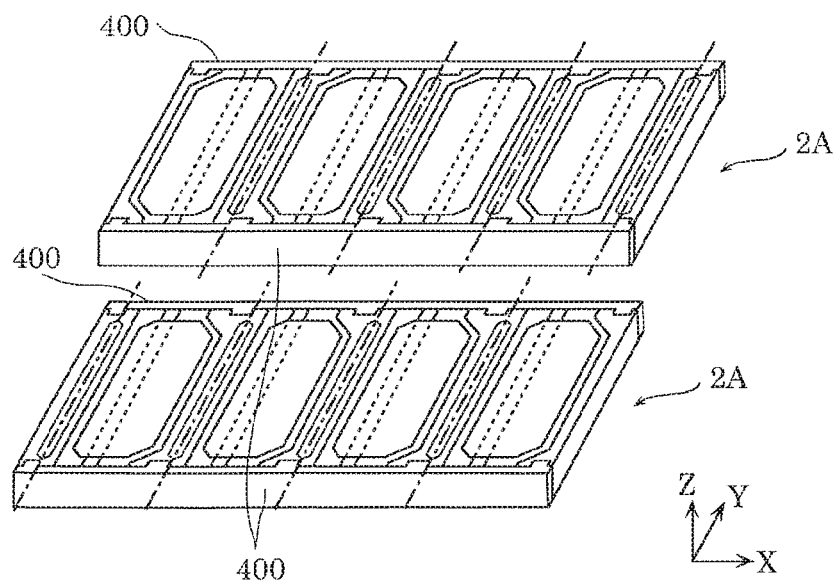
FIG. 5D illustrates a process for forming end surface coating films on bar-shaped substrates in the method of manufacturing the semiconductor laser element according to the embodiment.

Next, as illustrated in FIG. 5D, end surface coating films 400 are formed on the cleavage planes of bar-shaped substrates 2A obtained by cleavage. Specifically, end surface coating film 400 is formed on each of the cleavage planes of each bar-shaped substrate 2A.

Each of end surface coating films 400 includes, for example, an AlON film serving as an adhesion layer which is in close contact with the cleavage plane, an AlN film serving as an oxygen diffusion prevention layer, and a reflectivity adjustment layer. As an example, end surface coating film 400 having a reflectivity of 2% is formed on the cleavage plane which serves as the front end surface (third side surface 1c) of semiconductor laser element 1, and end surface coating film 400 having a reflectivity of 95% is formed on the cleavage plane which serves as the rear end surface (fourth side surface 1d) of semiconductor laser element 1.

Figure 5E:
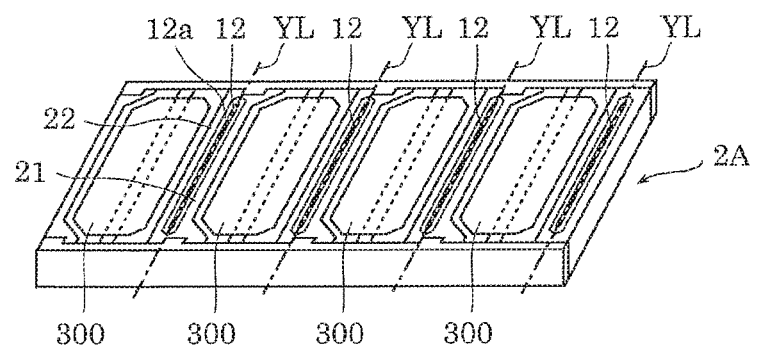
FIG. 5E illustrates a process for forming second recesses in the method of manufacturing the semiconductor laser element according to the embodiment.

Next, as illustrated in FIG. 5E, second recesses 12 are formed in bar-shaped substrate 2A along lengthwise separation lines YL. Each second recess 12 is an element isolation trench used when bar-shaped substrate 2A is separated into a plurality of individual elements. In the present embodiment, second recess 12 is a laser scribe trench formed by the laser scribe method.

As illustrated in FIG. 5E, each second recess 12 is formed along the Y-axis direction, between two element forming regions 300 adjacent to each other in the X-axis direction. In the present embodiment, separation trench forming region 12a sandwiched between first trench 21 and second trench 22 is formed between two element forming regions 300 which are adjacent to each other in the X-axis direction. Second recess 12 is formed in separation trench forming region 12a. In other words, each second recess 12 is formed between first trench 21 and second trench 22 which sandwich separation trench forming region 12a.

Figure 5F:
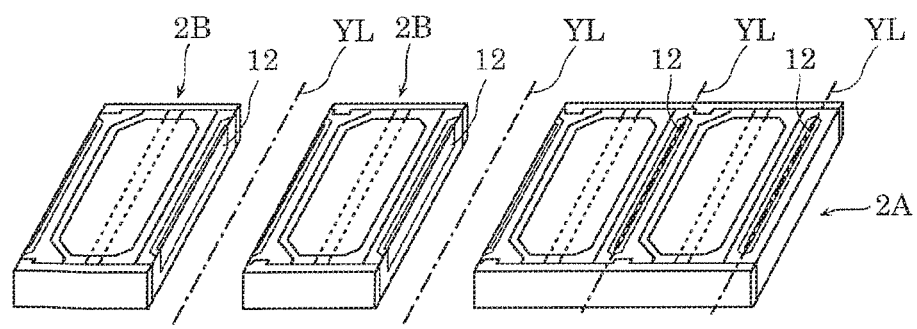
FIG. 5F illustrates a process for separating the bar-shaped substrate in the method of manufacturing the semiconductor laser element according to the embodiment.

Next, each of bar-shaped substrates 2A is sequentially separated along lengthwise separation lines YL, so that individual elements 2B each corresponding to semiconductor laser element 1 are manufactured as illustrated in FIG. 5F. In the present embodiment, bar-shaped substrate 2A is separated using second recesses 12 to divide one bar-shaped substrate 2A into a plurality of individual elements 2B.

Specifically, load is applied to bar-shaped substrate 2A with second recesses 12 by causing a blade-shaped tool extending in the Y-axis direction to contact with bar-shaped substrate 2A from n-side electrode 270 side along second recess 12. Accordingly, bar-shaped substrate 2A is separated along the longitudinal direction of second recesses 12. In other words, bar-shaped substrate 2A is separated along lengthwise separation line YL.

At this time, bar-shaped substrate 2A is separated at each of second recesses 12 formed along the Y-axis direction. As a result, a plurality of individual elements 2B (semiconductor laser elements 1) are obtained from one bar-shaped substrate 2A. In this way, semiconductor laser element 1 with the configuration illustrated in FIG. 1 can be manufactured.

[Method of Forming First Recess (Puncture)]

Figure 8:
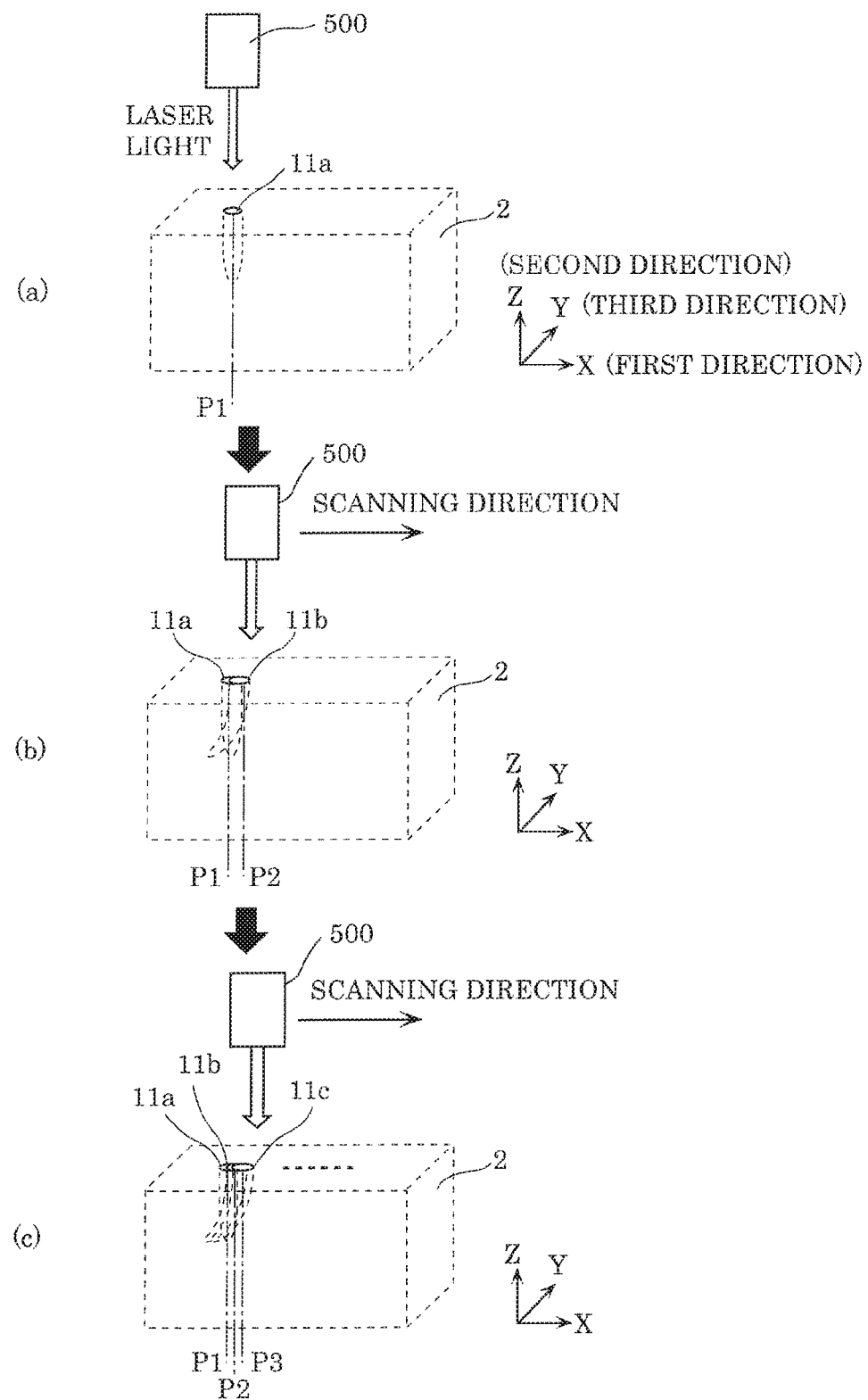
FIG. 8 illustrates a method of forming the first recess in the semiconductor laser element substrate using a light beam.

Now, a method of forming first recess 11 (puncture) in semiconductor laser element substrate 2 by using a light beam will be described with reference to FIG. 8. FIG. 8 illustrates a method of forming first recess 11 in semiconductor laser element substrate 2 by using a light beam.

In the present embodiment, a laser beam is used as a light beam. More specifically, a pulsed laser beam is used as a light beam. As an example, the conditions of the pulsed laser beam are as follows: the wavelength is 355 nm, the beam diameter is 3 μm or less, the pulse interval is 0.06 μm, the frequency is 50 kHz, the pulse width is about 20 ns, the highest laser average power is 100 mW, the energy of one pulse is 2 μJ, and the highest pulse peak power is about 100 W. Laser beam irradiation device 500 including a laser oscillator can be used for irradiating semiconductor laser element substrate 2 with a laser beam.

First, as illustrated in (a) of FIG. 8, laser beam irradiation device 500 irradiates first position P1 on the surface of semiconductor laser element substrate 2 with a first pulse of a laser beam (laser light) to form first puncture 11a.

Next, as illustrated in (b) of FIG. 8, after the step of forming first puncture 11a, second puncture 11b which at least partially overlaps first puncture 11a is formed by irradiating second position P2 on the surface of semiconductor laser element substrate 2 with a second pulse of the laser beam. Second position P2 is a position away from first position P1 in the positive X-axis direction (first direction). In other words, second puncture 11b is formed by scanning the laser beam to the position where second puncture 11b at least partially overlaps first puncture 11a and performing irradiation with the second pulse of the laser beam.

At this time, the tip of second puncture 11b positioned inside semiconductor laser element substrate 2 is bent in the negative X-axis direction (the direction opposite to the first direction).

Next, as illustrated in (c) of FIG. 8, after the step of forming second puncture 11b, third puncture 11c which at least partially overlaps second puncture 11b is formed by irradiating third position P3 on the surface of semiconductor laser element substrate 2 with a third pulse of the laser beam. Third position P3 is a position away from second position P2 in the positive X-axis direction (first direction). In other words, third puncture 11c is formed by scanning the laser beam to the position where third puncture 11c at least partially overlaps second puncture 11b and performing irradiation with the third pulse of the laser beam.

At this time, the tip of third puncture 11c positioned inside semiconductor laser element substrate 2 is bent in the negative X-axis direction (the direction opposite to the first direction).

In the present embodiment, the laser beam with which semiconductor laser element substrate 2 is irradiated is linearly polarized light, and is polarized in the direction perpendicular to the X-axis direction (first direction). In other words, when first puncture 11a, second puncture 11b, and third puncture 11c are sequentially formed, the laser beam is polarized in the Y-axis direction which is perpendicular to the X-axis direction which is the direction in which the laser beam is moved from first position P1 to second position P2. Specifically, the polarization direction of the laser beam with which semiconductor laser element substrate 2 is irradiated is controlled by using a wave plate or the like.

As described above, in the present embodiment, while moving the laser beam polarized in the direction (Y-axis direction) perpendicular to the moving direction of the laser beam (first direction: X-axis direction), a plurality of punctures are sequentially formed by irradiation with pulsed laser beams performed so as to overlap the puncture formed immediately before. In this way, it is possible to successively and sequentially form punctures with tips bent in the direction opposite to the moving direction of the laser beam.

For example, by forming second puncture 11b with the second pulse so as to overlap first puncture 11a formed with the first pulse, the tip of second puncture 11b can be bent in the direction (negative X-axis direction) opposite to the moving direction of the laser beam. Moreover, by forming third puncture 11c with the third pulse so as to overlap second puncture 11b formed with the second pulse, the tip of third puncture 11c can be bent in the direction opposite to the moving direction of the laser beam. Since there is no puncture prior to the first puncture formed with the first pulse (first puncture 11a), the tip of first puncture 11a extends vertically downward (in the negative Z-axis direction) with no inclination.

In this way, by performing irradiation of a polarized laser beam with pulses a plurality of times (for example, about 20 to 30 times) so as to overlap each other, one puncture with bent tips can be formed with use of reflection and absorption of the laser beam relative to the polarization direction.

In order to move the laser beam, laser beam irradiation device 500 may be moved, or semiconductor laser element substrate 2 (specifically, the stage on which semiconductor laser element substrate 2 is placed) may be moved. In other words, the laser beam may be moved relatively to semiconductor laser element substrate 2.

Figure 9:
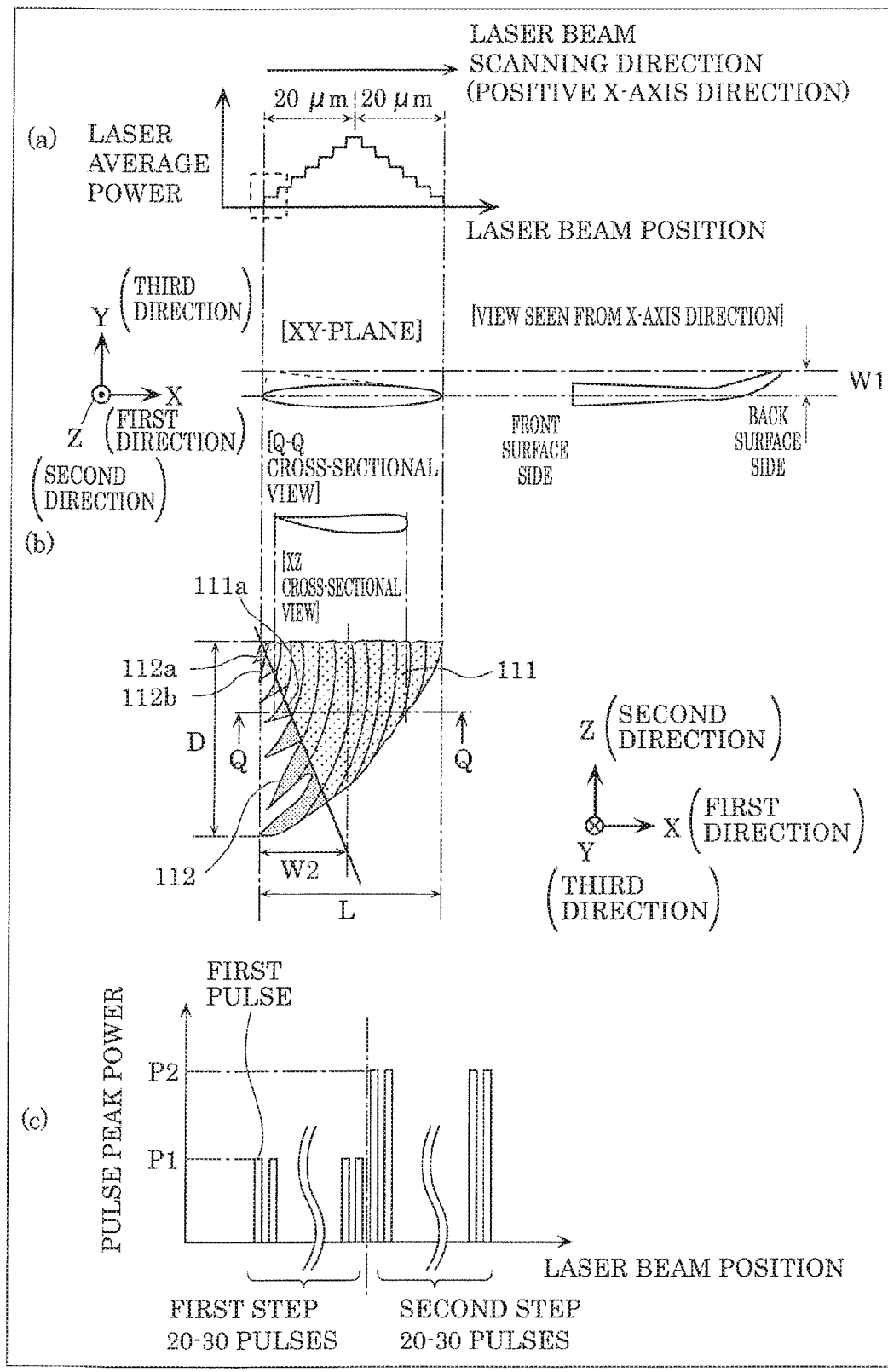
FIG. 9 illustrates, in (a), a relationship between an average power of a laser beam and a laser beam position when the first recess is formed according to the embodiment, illustrates, in (b), a shape of the first recess according to the embodiment; and illustrates, in (c), a pulse irradiation method for the region surrounded by dashed lines in (a) of FIG. 9.

Here, a specific method of forming punctures for forming first recess 11 in the present embodiment will be described with reference to FIG. 9. In FIG. 9, (a) illustrates a relationship between the average power of the laser beam and the laser beam position at the time of forming first recess 11 according to the present embodiment, and (b) illustrates a shape of first recess 11 according to the present embodiment.

The sequence of pulsed laser beam irradiation at the time of forming first recess 11 is performed as illustrated in (a) of FIG. 9. Specifically, while scanning the laser beam in the positive X-axis direction, the average power of the laser beam is gradually increased from a zero state to a given value in a stepwise manner, and the average power is gradually reduced in a stepwise manner after reaching the given value.

At this time, irradiation of the pulsed laser beam is performed by the method illustrated in FIG. 8. In other words, while scanning a laser beam polarized in the direction perpendicular to the scanning direction of the laser beam, punctures are formed by sequentially performing irradiation with the pulsed laser beam so as to overlap with the puncture formed immediately before. Accordingly, in each step, it is possible to sequentially form a puncture with a tip bent in the direction opposite to the moving direction of the laser beam.

Here, in the present embodiment, as illustrated in (a) of FIG. 9, a pulsed laser beam is irradiated such that the laser average power has a 13-stepped shape. In FIG. 9, (c) illustrates the pulse irradiating method relative to the first and second steps which are indicated by the broken lines of (a) of FIG. 9. The pulsed laser beam is irradiated with pulse peak power P1 at the first step and with pulse peak power P2 at the second step. As illustrated in (c) of FIG. 9, the number of irradiated pulses for one step of the laser average power in (a) of FIG. 9 is 20 to 30 times. Up to the seventh step, the average power of the laser beam is increased compared to that in the previous step, and in the eighth step and the subsequent steps, the average power of the laser beam is reduced compared to that in the previous step.

Accordingly, first recess 11 having the shape as illustrated in (b) of FIG. 9 can be formed. Here, among second regions 112, second region 112a is a portion formed by performing pulse irradiation 20 to 30 times with pulse peak power P1 of the first step in (c) of FIG. 9. After second region 112a is formed, the depth of the puncture can be increased by increasing the pulse peak power to pulse peak power P2 of the second step. At the time of the first pulse irradiation after the pulse peak power is increased to pulse peak power P2 of the second step, a puncture is formed extending deeper than second region 112a and vertically downward (in the negative Z-axis direction) without the tip being bent. After that, by performing pulse irradiation with the same pulse peak power P2 at the position moved in the positive X-axis direction so as to overlap the puncture extending deeper, a puncture can be formed which is bent in the direction (the negative X-axis direction) opposite to the moving direction of the laser beam. By performing such pulse irradiation 20 to 30 times, second region 112b is formed. When the laser average power in (a) of FIG. 9 is increased (first to seventh steps), one second region 112 having a line shape is formed with one step of the laser average power. Accordingly, the number of second regions 112 having a line shape corresponds to the number of steps (including the first step) in which the laser average power is increased compared to that in the previous step, and the number of second regions 112 having a line shape is seven. When the laser average power is reduced compared to that in the previous step, no second region having a line shape is formed.

First recess 11 formed in such a manner has a line shape along the X-axis (first direction) in the plan view of semiconductor laser element substrate 2. In other words, first recess 11 extends in the X-axis direction, and has an opening having a line shape.

Length L of first recess 11 in the X-axis direction is, for example, 30 μm to 45 μm. In other words, the moving distance of the laser beam when forming one first recess 11 is 30 μm to 45 μm. In the present embodiment, the moving distance of the laser beam is set to 40 μm. Depth D of first recess 11 is, for example, 5 μm to 60 μm.

In the vertical cross-sectional view (XZ cross-sectional view) of semiconductor laser element substrate 2, first recess 11 includes first region 111 (the region indicated by the light dotted hatching in (b) of FIG. 9) and second regions 112 (the regions indicated by dark dotted hatching in (b) of FIG. 9). First region 111 has a planar shape which spreads to a plane defined by the positive X-axis direction (first direction) and the Z-axis direction (second direction) which is the depth direction of semiconductor laser element substrate 2. Each of second regions 112 has a line shape which extends from first region 111 in the negative X-axis direction which is the opposite to the positive X-axis direction.

First region 111 includes side portion 11a below the opening of first recess 11 in the plan view of semiconductor laser element substrate 2. Side portion 111a of first region 111 is a portion formed by connecting the valleys of second regions 112 (by connecting the joint portions of the adjacent second regions and the end portion of the opening of first recess 11 on the second region 112 side). In the present embodiment, in the vertical cross-sectional view of semiconductor laser element substrate 2, first region 111 has a substantially triangular cross section, and side portion 111a forms one side of the triangle.

Moreover, first region 111 has a plurality of striped portions extending from the surface of semiconductor laser element substrate 2 toward the inner side of semiconductor laser element substrate 2 in the vertical cross-sectional view of semiconductor laser element substrate 2. The striped pattern of the striped portions is formed by a change in the average power of the laser beam. In other words, by scanning the laser beam while changing the average power of the laser beam in a stepwise manner to form first recess 11, the width of each stripe of the striped portion (trench width) is changed. Accordingly, the striped pattern is formed as a remaining step trace. It should be noted that the width of each stripe of the striped portion is about 1 μm to 4 μm. Although the shape of the puncture in the XY plan view of FIG. 9 is drawn with smooth curve lines, the width of the actual puncture varies between seven levels according to the difference in laser average power such that the width is narrower when the laser average power is weaker, and the width is wider when the laser average power is stronger.

Two or more second regions 112 are formed. Each of second regions 112 extends from side portion 111a of first region 111. The length of second region 112 extending from side portion 111a of first region 111 (the total length of second region 112) is at least 2 μm.

The tips of second regions 112 are bent in the opposite direction to first region 111. Specifically, each of second regions 112 extends in the direction (negative X-axis direction) opposite to the scanning direction of the laser beam. In other words, the direction in which second region 112 extends coincides with the separating direction (the crack advancing direction) at the time of separating semiconductor laser element substrate 2. Moreover, as illustrated in the Q-Q cross-sectional view of (b) of FIG. 9, since the negative X-axis side is second region 112 having a line shape, the tip of the puncture has an acute angle. In this way, by making the extending direction of each second region 112 coincide with the separating direction of semiconductor laser element substrate 2 and making the tip of the puncture on the crack advancing direction side have an acute angle, the stress at the time of separating can be concentrated on the tips of second regions 112. Accordingly, the flatness of the separated surface obtained when semiconductor laser element substrate 2 is separated (cleaved) can be increased.

In the present embodiment, each first recess 11 includes a plurality of second regions 112. In other words, a plurality of second regions 112 extend in a beard shape from side portion 111a of first region 111. Specifically, seven second regions 112 are formed. Note that all of seven second regions 112 extend so as to incline in the same direction. By forming second regions 112 as described above, the flatness of the separated surface at the time of separating (cleaving) semiconductor laser element substrate 2 can be further increased.

In this case, in the cross section including first region 111 of semiconductor laser element substrate 2, second regions 112 positioned on the inner side of semiconductor laser element substrate 2 are longer than second regions 112 positioned closer to the surface side of semiconductor laser element substrate 2. In other words, the length of second region 112 increases as the position of second region 112 becomes lower. By making second regions 112 positioned lower longer, the flatness of the separated surface at the time of separating (cleaving) semiconductor laser element substrate 2 can be further increased.

Moreover, the view in (b) of FIG. 9 seen from the X-axis direction illustrates the puncture formed with the maximum laser average power (seventh step). The tips of second regions 112 are bent in the Y-axis direction (third direction), which is the direction perpendicular to both the X-axis direction (first direction) and the Z-axis direction (second direction). In this case, for example, the bending length (W) of second region 112 in the Y-axis direction is shorter than the length (W2) of second region 112 in the X-axis direction. Bending length W1 (bending width) of second region 112 in the Y-axis direction increases as the average power of the laser beam increases, and decreases as the average power of the laser beam decreases. In (b) of FIG. 9, although each second region 112 is bent in the positive Y-axis direction, second region 112 may be bent in the negative Y-axis direction depending on the polarization direction of the laser beam.

The bending length of second region 112 formed in such a manner may be shorter (or have no bent portion). However, as described above, by setting W1<W2, the tip of first recess 11 and the cleavage plane can be made further coincide with each other. Hence, the flatness of the separated surface at the time of separating semiconductor laser element substrate 2 can be increased. In this case, W1 is preferably less than or equal to 1 µm, and more preferably less than or equal to 0.5 µm.

In addition, the length (W2) of second region 112 in the X-axis direction (first direction) is less than the length of second region 112 in the Z-axis direction (second direction). In the present embodiment, the length of second region 112 in the Z-axis direction (second direction) is the same as depth D of first recess 11. In other words, the bottom of first recess 11 is the tip of second region 112 positioned deepest among second regions 112. Hence, the length (W2) of second region 112 in the X-axis direction is less than the length (D) of second region 112 in the Z-axis direction. By setting W2<D as described above, the angle of each tip of second regions 112 approaches the direction in which stress is applied when semiconductor laser element substrate 2 is separated. Hence, the step region in the cleavage plane is reduced, and the number of steps generated is also reduced. Accordingly, the flatness of the separated surface of semiconductor laser element substrate 2 can be increased.

Moreover, in the present embodiment, in the vertical cross-sectional view of semiconductor laser element substrate 2, the shape formed by first region 111, second regions 112, and a line connecting the tips of second regions 112 is a substantially triangular. In other words, the shape of first recess 11 in the vertical cross-sectional view of semiconductor laser element substrate 2 is substantially triangular. Note that one of the three sides of first recess 11 forming a substantially triangular shape is a side connecting the tips of second regions 112.

For each of first recesses 11 formed in such a manner, the inclination direction of the punctures forming first recess 11 can be adjusted by using the reflection and absorption of the laser beam relative to the polarization direction.

Here, the formation of punctures in the sample using reflection and absorption of the laser beam relative to the polarization direction will be described below.

The polarization direction of the laser beam can be changed by using a wave plate. A wave plate is an example of a birefringent element which generates a phase difference between orthogonally polarized components. For example, the polarization direction of the laser beam can be controlled by using a λ/2 wave plate.

Figure 10:
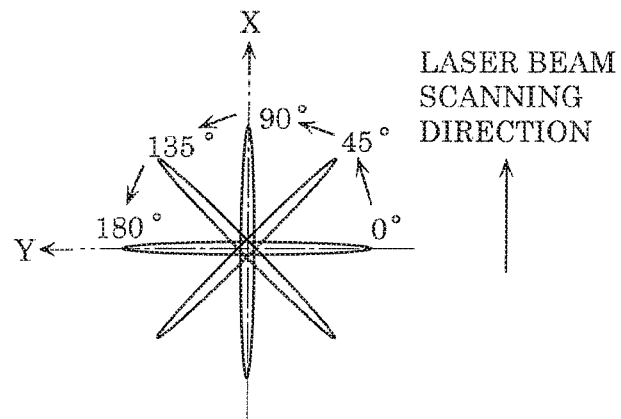
FIG. 10 illustrates a relationship between a laser beam movement direction and a polarization direction of a linearly polarized light of a laser beam.

FIG. 10 illustrates a relationship between the moving direction of the laser beam (laser scanning direction) and the polarization direction of the linearly polarized light of the laser beam. As illustrated in FIG. 10, it is defined that the angle of the polarization direction (resultant vector) of the linearly polarized light of the laser beam is perpendicular to the laser scanning direction (X-axis direction) at 0° or 180°, and is parallel to the laser scanning direction at 90° or 270°.

Figure 11:
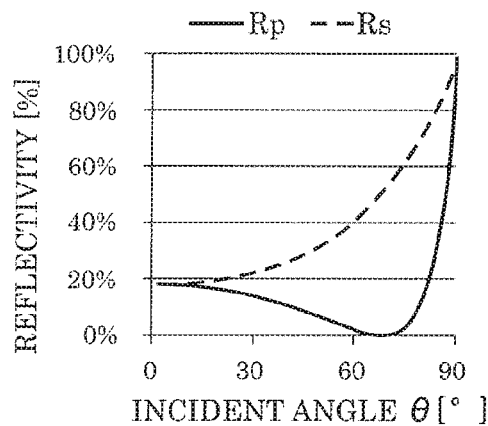
FIG. 11 illustrates a reflectivity relative to an incident angle of a laser beam on a wall surface of a puncture formed in the sample.
Figure 12:
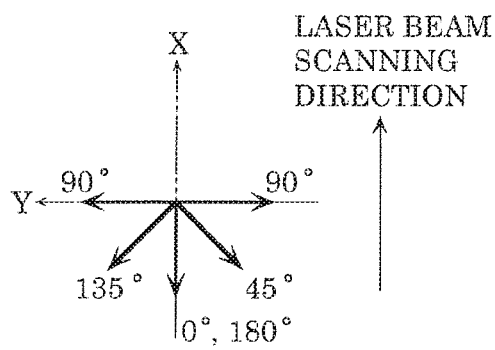
FIG. 12 is a top view for illustrating a relationship between a polarization angle of a laser beam and a bending direction of the first recess.

The polarization direction of the laser beam affects the inclination direction of the punctures formed in the sample, such as semiconductor laser element substrate 2. This point will be described with reference to FIG. 11 and FIG. 12. FIG. 11 illustrates an example of the reflectivity with respect to the incident angle of the laser beam on the wall surface of the puncture formed immediately before in the sample. FIG. 12 illustrates a relationship between the polarization direction of the laser beam and the inclination direction of the punctures formed in the sample.

As illustrated in FIG. 11, relative to the reflectivity of the laser beam obliquely incident on the wall surface of the puncture in the sample, the reflectivity (Rs) of S-polarized light which is perpendicular to the incident surface of the laser beam is greater than the reflectivity (Rp) of P-polarized light which is horizontal to the incident surface of the laser beam. On the other hand, the absorptance of S-polarized light is less than the absorptance of P-polarized light. In other words, the absorptance of the P-polarized light of the laser beam to the sample is greater than the absorptance of the S-polarized light of the laser beam to the sample.

As a result, the laser intensity of the P-polarized light attenuates faster than the S-polarized light due to absorption to the sample, so that the S-polarized light component of the laser beam that is obliquely incident on the wall surface enters the sample deeper. As illustrated in FIG. 12, the tips of the punctures formed in the sample by the laser beam are bent in the reflection direction of the S-polarized laser beam that has a relatively strong intensity deep in the sample. In other words, when the polarization direction of the laser beam is other than 0°, the tips of the punctures formed in the sample by the laser beam are bent in the direction (Y-axis direction) orthogonal to the laser beam scanning direction (X-axis direction) and the depth direction of the punctures (Z-axis direction).

Accordingly, by adjusting the polarization direction of the linearly polarized light of the laser beam, the inclination direction of the tips of the punctures formed in the sample, such as semiconductor laser element substrate 2, can be controlled.

Moreover, by adjusting the polarization direction of the linearly polarized light of the laser beam, the bending direction of the tip portion of first recess 11 (tip portions of second regions 112) can also be controlled.

Figure 13:
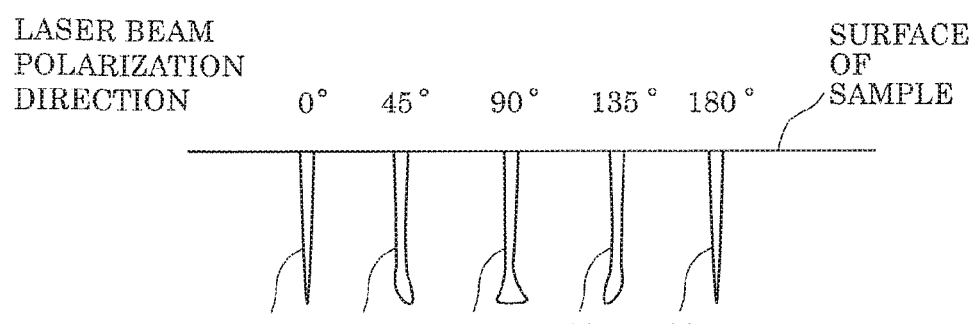
FIG. 13 illustrates a relationship between a polarization angle of a laser beam and bending of the first recess.
Figure 13:
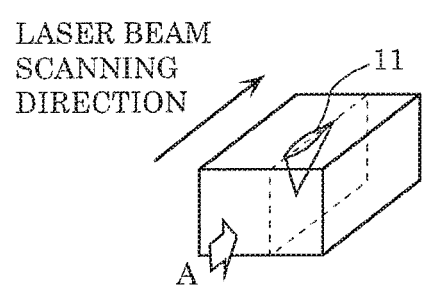

In FIG. 13, (a) illustrates the shapes of the punctures formed in first recesses 11 at the maximum laser average power (for example, seventh step of the laser average power in (a) of FIG. 9) when viewed from the direction of arrow A in (b) of FIG. 13. For example, when the angle (polarization angle) of the polarization direction of the linearly polarized light of the laser beam is 0° or 180°, as illustrated in (a) of FIG. 13, first recess 11 formed by the laser beam has a tip without being bent in the Y-axis direction. On the other hand, when the angle (polarization angle) of the polarization direction of the linearly polarized light of the laser beam is other than 0° or 180° (for example, when the polarization angle is 45°, 90°, or 135°), the tip of first recess 11 is bent in the Y-axis direction.

As described above, a plurality of punctures are sequentially formed by performing irradiation of a pulsed laser beam so as to substantially overlap the puncture formed immediately before while moving the laser beam polarized in the direction perpendicular to the moving direction (scanning direction) of the laser beam. By doing so, first recess 11 can be formed in which the tips of the punctures are not bent in the direction (Y-axis direction) orthogonal to the scanning direction of the laser beam (X-axis direction) and the depth direction of the punctures (Z-axis direction).

Note that the method of forming the punctures by laser beam irradiation is not limited to the case of forming punctures in semiconductor laser element substrate 2, but can also be applied to samples other than semiconductor laser element substrate 2. For example, the method can also be applied to a semiconductor element substrate for forming a semiconductor element, such as an LED or a transistor. Examples of the material of the sample (substrate) may include diamond and SiC.

[Specific Example of Separating Semiconductor Laser Element Substrate]

Next, a specific example of separating semiconductor laser element substrate 2, in which first recesses 11 with the shape illustrated in (b) of FIG. 9 are formed, by the puncture forming method described above will be described with reference to FIG. 5A to FIG. 5C.

First, before forming first recess 11 in semiconductor laser element substrate 2, as illustrated in FIG. 5A, a plurality of waveguides 201, which extend in a fourth direction which is parallel to the surface of semiconductor laser element substrate 2, are formed. In the present embodiment, the fourth direction in which each waveguide 201 extends is the direction (Y-axis direction) perpendicular to the laser beam scanning direction (first direction: X-axis direction) used when first recess 11 is formed.

Next, as illustrated in FIG. 5B, first recesses 11 are formed in semiconductor laser element substrate 2. Specifically, a plurality of first recesses 11 are formed in semiconductor laser element substrate 2 along crosswise separation lines XL. At this time, each first recess 11 is formed between two adjacent waveguides 201. First recess 11 is formed by the method of forming first recess 11 described above. Accordingly, first recess 11 with the shape illustrated in (b) of FIG. 9 can be formed.

Next, as illustrated in FIG. 5C, semiconductor laser element substrate 2 is separated along first recesses 11. Specifically, semiconductor laser element substrate 2 is cleaved along first recesses 11. Hence, the separated surface of semiconductor laser element substrate 2 is a cleavage plane. By separating semiconductor laser element substrate 2 along first recesses 11 as described above, waveguides 201 are cut, so that a plurality of bar-shaped substrates 2A are manufactured.

In the present embodiment, semiconductor laser element substrate 2 is separated so that the crack advances from the first region 111 side of first recess 11 to the second region 112 side of first recess 11. In other words, semiconductor laser element substrate 2 is separated such that the separating direction of semiconductor laser element substrate 2 is opposite to the laser beam scanning direction at the time of forming first recess 11. Accordingly, the flatness of the separated surface of semiconductor laser element substrate 2 can be increased.

Figure 14:
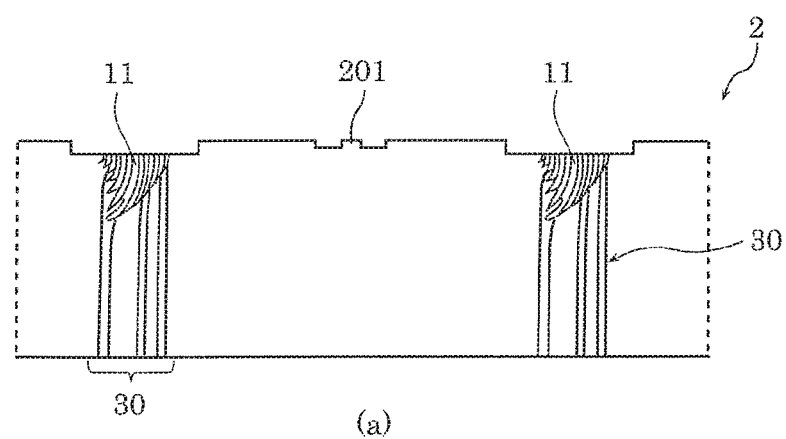
FIG. 14 illustrates a shape of a separated surface of the semiconductor laser element substrate according to the embodiment.
Figure 14:
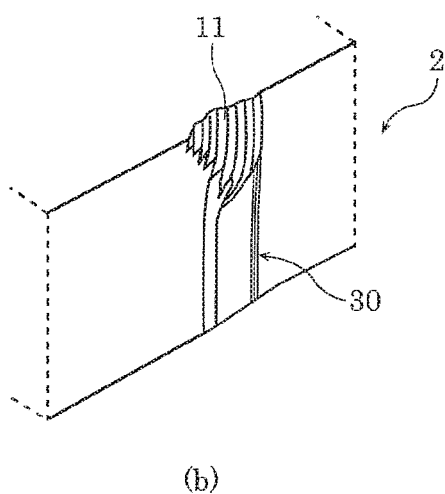

The shape of the end surface of semiconductor laser element substrate 2 separated in such a manner is as illustrated in FIG. 14. FIG. 14 illustrates the shape of the separated surface (resonator surface) of semiconductor laser element substrate 2 according to the present embodiment, where (a) is a side view and (b) is a perspective view.

As illustrated in (a) and (b) of FIG. 14, in the side view of semiconductor laser element substrate 2 after the separating step, steps 30 are formed in the vicinity of each first recess 11 on the separated surface (cleavage plane) of semiconductor laser element substrate 2. Steps 30 are generated when cleavage is performed in a state where the tip direction of first recess 11 and the crystal plane (cleavage plane) of semiconductor laser element substrate 2 are misaligned from each other. In other words, steps 30 are generated on the cleavage plane (end surface) of semiconductor laser element substrate 2 due to the misalignment of the cleavage from the crystal plane of semiconductor laser element substrate 2. Steps 30 thus formed extend from first region 111 and second regions 112 in first recess 11 toward the back surface of semiconductor laser element substrate 2. Specifically, steps 30 extend from the front surface of semiconductor laser element substrate 2 vertically to the back surface of semiconductor laser element substrate 2 or in the direction in which the crack advances at the time of separating, starting from first region 111 and the tips of second regions 112 in first recess 11.

In the region where second regions 112 are formed, unevenness is present due to second regions 112, so that stress at the time of separating concentrates on the tips of second regions 112. In other words, the stress at the time of separating can be concentrated at specific positions. For this reason, not many steps 30 are generated from second regions 112. On the other hand, in the region where first region 111 is formed, there is no unevenness, so that stress at the time of separating does not concentrate on a specific position. For this reason, many steps 30 are generated from first region 111. Hence, the number of steps 30 extending from first region 111 excluding second regions 112 is greater than the number of steps 30 extending from second regions 112. Specifically, as illustrated in FIG. 14, the number of steps extending from second regions 112 is two, and the number of steps extending from first region 111 is four.

By forming second regions 112 in first recess 11 as described above, the stress at the time of separating can be concentrated on the tips of second regions 112 due to the unevenness of second regions 112. Accordingly, the fluctuation range on the separated surface is small, and the number of steps 30 generated can be reduced. Hence, it is possible to increase the flatness of the separated surface at the time of separating (cleaving) semiconductor laser element substrate 2.

Figure 15:
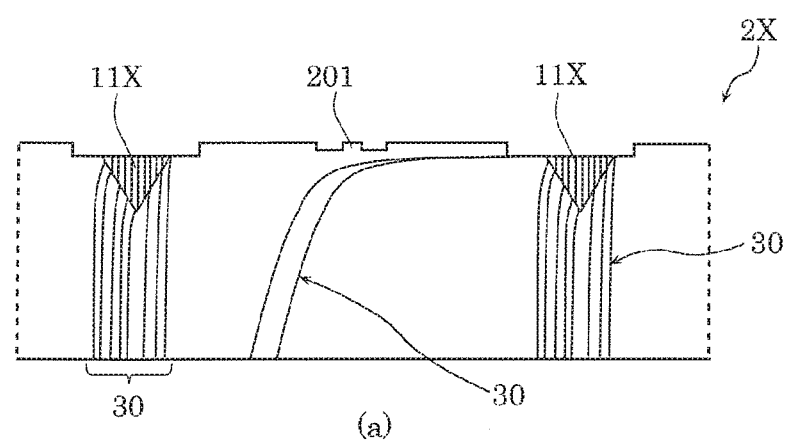
FIG. 15 illustrates a shape of a separated surface of a semiconductor laser element substrate according to a comparative example.
Figure 15:
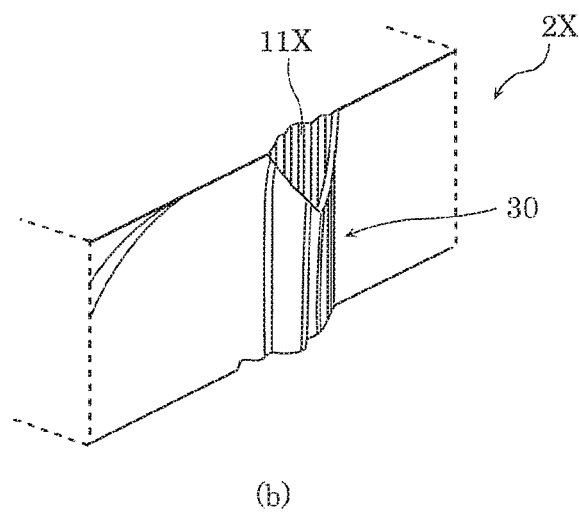

When first recesses 11X are formed without forming second regions 112, as illustrated in FIG. 15, many steps 30 are generated on the separated surface of semiconductor laser element substrate 2X according to a comparative example. This is because each first recess 11X illustrated in FIG. 15 includes only first region 111 in first recess 11 illustrated in FIG. 14. In other words, since first recess 11X does not include unevenness corresponding to second regions 112, the stress at the time of separating does not concentrate on specific positions. As a result, the fluctuation range on the separated surface is large, and many steps 30 are generated from first recess 11X. As a result, the flatness of the separated surface of semiconductor laser element substrate 2X according to the comparative example is reduced.

In particular, in semiconductor laser element substrate 2X according to the comparative example, steps 30 are generated not only in the vicinity of first recess 11X but also in the vicinity of waveguide 201. As a result, when semiconductor laser element substrate 2X is diced to manufacture semiconductor laser elements, the element characteristics and reliability of each of the semiconductor laser elements are reduced.

Figure 16:
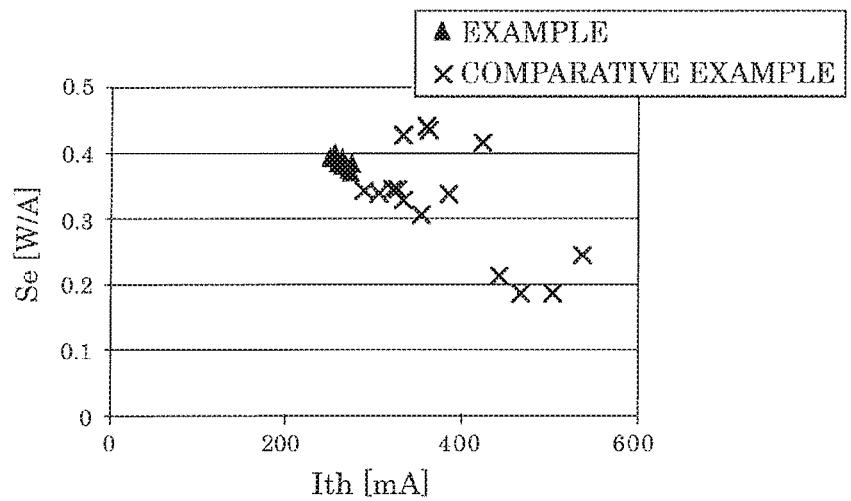
FIG. 16 illustrates a relationship between threshold current (Ith) and slope efficiency (Se) in an example and the comparative example.
Figure 17:
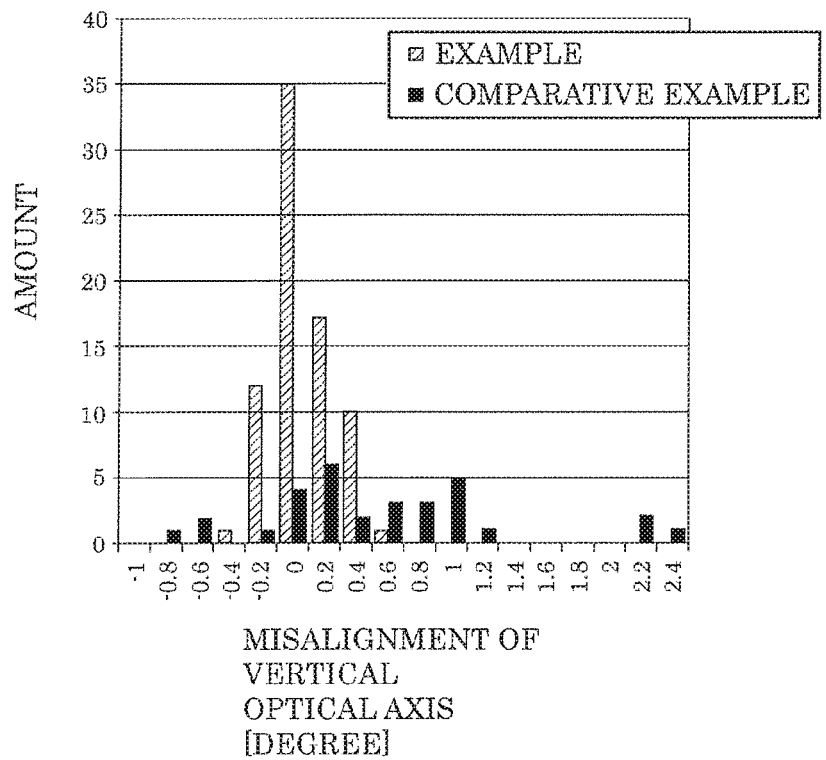
FIG. 17 illustrates misalignment of vertical optical axis in the example and the comparative example.

Here, the element characteristics and the misalignment of vertical optical axis on the separated surface were measured relative to the semiconductor laser element (Example) obtained by separating semiconductor laser element substrate 2 illustrated in FIG. 14 into individual pieces and the semiconductor laser element (Comparative Example) obtained by separating semiconductor laser element substrate 2X illustrated in FIG. 15 into individual pieces. The measurement results will be described with reference to FIG. 16 and FIG. 17. FIG. 16 illustrates a relationship between the threshold current (Ith) and the slope efficiency (Se) in the example and the comparative example. FIG. 17 illustrates the misalignment of vertical optical axis in the example and the comparative example.

As illustrated in FIG. 16, relative to the semiconductor laser element according to the comparative example, the slope efficiency decreases as the threshold current increases. In addition, the semiconductor laser element according to the comparative example greatly varies in element characteristics. In contrast, the semiconductor laser element according to the example is capable of reducing the threshold current and maintaining high slope efficiency as compared with the semiconductor laser element according to the comparative example. In addition, the semiconductor laser element according to the example has small variations in element characteristics.

Moreover, as illustrated in FIG. 17, the semiconductor laser element according to the comparative example has large misalignment of the vertical optical axis on the separated surface. For this reason, in the semiconductor laser element according to the comparative example, the angle in the vertical direction relative to the laser oscillation is not stabilized, and thus, not only the light emission characteristics but also the electrical characteristics and reliability are reduced. In contrast, the semiconductor laser element according to the example has small misalignment of the vertical optical axis on the separated surface. Accordingly, in the semiconductor laser element according to the example, the angle in the vertical direction relative to the laser oscillation is stabilized, leading to high electrical characteristics and high reliability.

Although the case where the puncture forming method illustrated in FIG. 8 is used at the time of forming first recesses 11 (primary scribe trenches) for cleavage has been described above, the present disclosure is not limited to such an example. For example, when forming second recesses 12 (secondary scribe trenches) used at the time of separating bar-shaped substrate 2A into individual pieces, the puncture formation method illustrated in FIG. 8 may be used.

In this case, a linearly polarized laser beam is used when forming first recess 11, but a circularly polarized laser beam may be used when forming second recess 12. For example, the laser beam can be circularly polarized by using a λ/4 wave plate.

Figure 18:
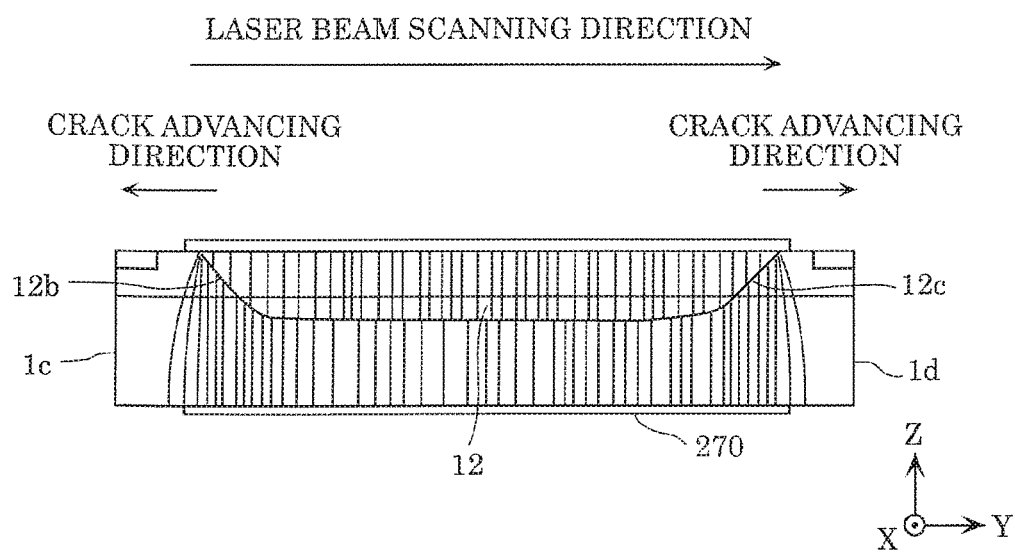
FIG. 18 is a side view of the semiconductor laser element according to the embodiment.
Figure 19:
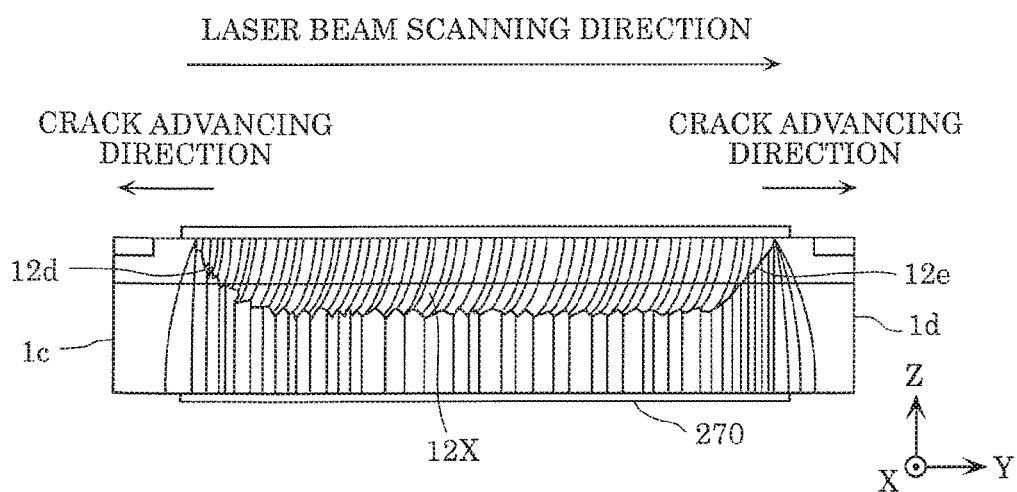
FIG. 19 is a side view of a semiconductor laser element according to the comparative example.

FIG. 18 illustrates a shape of second recess 12 formed using a circularly polarized laser beam in the side view of semiconductor laser element 1. In contrast, FIG. 19 illustrates a shape of second recess 12X formed using a linearly polarized laser beam whose polarization direction is perpendicular to the laser beam scanning direction, in the side view of semiconductor laser element 1. The shape of each of second recess 12 and second recess 12X in the side view is a substantially trapezoidal shape having an upper base, which is the surface side of semiconductor laser element substrate 2, and a lower base which is shorter than the upper base. The laser beam scanning direction is from the negative Y-axis side toward the positive Y-axis side.

At the time of separating, the semiconductor laser element substrate is separated by pressing a blade-shaped tool against the back surface of the semiconductor laser element substrate along second recess 12 or second recess 12X with second recess 12 or second recess 12X as a starting point. Hence, as illustrated in FIG. 18 and FIG. 19, the crack advancing direction relative to inclined surface 12b and inclined surface 12d is the direction toward third side surface 1c, and the crack advancing direction relative to inclined surface 12c and inclined surface 12e is the direction toward fourth side surface 1d. As illustrated in FIG. 19, when a linearly polarized laser beam is used, second recess 12X is formed with the striped pattern bent in one direction. For this reason, the shape of inclined surface 12d on the starting point side (negative Y-axis side) in the laser beam scanning direction at the time of separating is uneven, and thus, stress is likely to concentrate. In addition, since the tips of the punctures are bent in the crack advancing direction, the flatness of the separated surface is high. On the other hand, the shape of inclined surface 12e on the end point side (the positive Y-axis side) in the laser beam scanning direction is not uneven, and stress is not concentrated. Hence, out-of-line separation may occur, leading to a poor separated shape.

In contrast, as illustrated in FIG. 18, when a circularly polarized laser beam is used, second recess 12 is formed such that the tips of the striped pattern are not bent very much, and the striped pattern extends in the Z-axis direction. Hence, when second recess 12 is seen from the side, the shape of second recess 12 is axisymmetric with respect to the Z-axis, and the shapes of inclined surfaces 12b and 12c of second recess 12 are the same. For this reason, the stress is uniformly applied to the starting point side and the ending point side of the laser beam scanning direction at the time of separating. As a result, it is possible to prevent occurrence of the out-of-line separation, leading to a separated surface having good flatness on both sides. However, the tips of the striped pattern on inclined surface 12b and inclined surface 12c are not inclined in the crack advancing directions (the negative and positive Y-axis directions, respectively). Hence, the flatness of the separated surface is slightly lower than the flatness of the separated shape on the starting point side of the laser beam scanning direction when the linearly polarized laser beam is used in FIG. 19.

Semiconductor laser element 1 manufactured as described above includes steps on at least one side surface. Specifically, as illustrated in FIG. 1, steps are formed on third side surface 1c and fourth side surface 1d which are the resonator surfaces. These steps are first recesses 11 which remain when semiconductor laser element substrate 2 is separated along first recesses 11. Accordingly, as illustrated in (b) of FIG. 9, in the side view of semiconductor laser element 1, first recess 11 includes first region 111 and second regions 112. First region 111 has a planar shape which spreads to a plane defined by the positive X-axis direction (first direction) and the Z-axis direction (second direction) which is the depth direction of semiconductor laser element substrate 2. Each of second regions 112 has a line shape which extends from first region 111 in the negative X-axis direction which is opposite to the positive X-axis direction.

(Variation)

Although the puncture forming method and the like according to the present disclosure have been described based on the embodiment, the present disclosure is not limited to the above embodiment.

Figure 20:
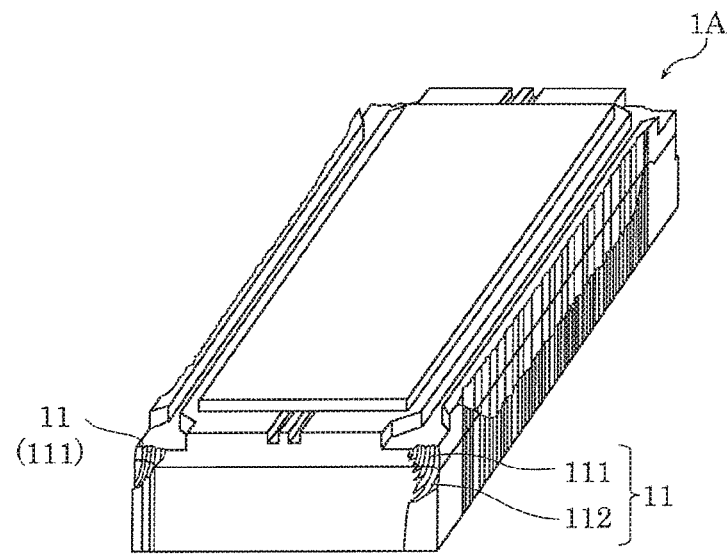
FIG. 20 is a perspective view of a semiconductor laser element according to a variation.

For example, in the above embodiment, as illustrated in FIG. 1, only one first recess 11 (first region 111) is present on one resonator surface of semiconductor laser element 1, but the present disclosure is not limited to such an example. Specifically, as illustrated in FIG. 20, two first recesses 11 (first regions 111) may be present on one resonator surface of semiconductor laser element 1A. In this case, each first recess 11 may include only first region 111 without second regions 112.

Figure 21:
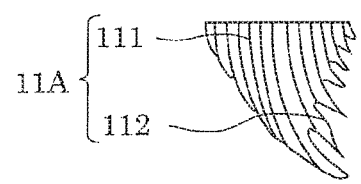
FIG. 21 illustrates a shape of a first recess according to Variation 1.

Moreover, in first recess 11 according to the above embodiment, second regions 112 extending from first region 111 extend in the negative X-axis direction, but the present disclosure is not limited to such an example. For example, by changing the scanning direction of the laser beam, each second region 112 may be formed so as to extend in the positive X-axis direction, as in first recess 11A illustrated in FIG. 21.

Figure 22:
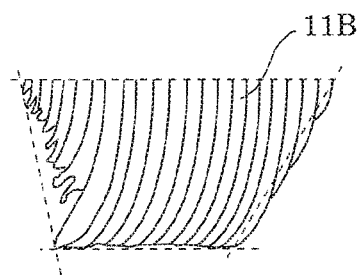
FIG. 22 illustrates a shape of a first recess according to Variation 2.
Figure 23:
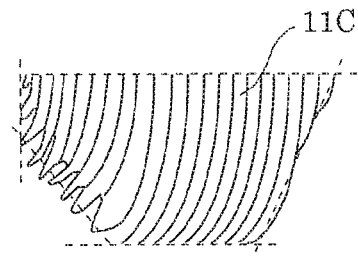
FIG. 23 illustrates a shape of a first recess according to Variation 3.

In the above embodiment, the shape formed by first region 111, second regions 112 in first recess and a line connecting the tips of second regions 112 (that is, the cross-sectional shape of first recess 11) is a substantially triangular shape, but the present disclosure is not limited to such an example. As illustrated in FIG. 22, the cross-sectional shape of first recess 11B may be a substantially trapezoidal shape having an upper base, which is the surface side of semiconductor laser element substrate 2, and a lower base shorter than the upper base. As illustrated in FIG. 23, the cross-sectional shape of first recess 11C may be a substantially pentagonal shape. Note that the cross-sectional shape of the first recess may be another polygonal shape.

In the above embodiment, the cross-sectional shape of first region 111 of first recess 11 is a substantial triangular shape. However, the present disclosure is not limited to such an example, and the shape may be a substantially trapezoidal shape having an upper base, which is the surface side of semiconductor laser element substrate 2, and a lower base shorter than the upper base.

Figure 24:
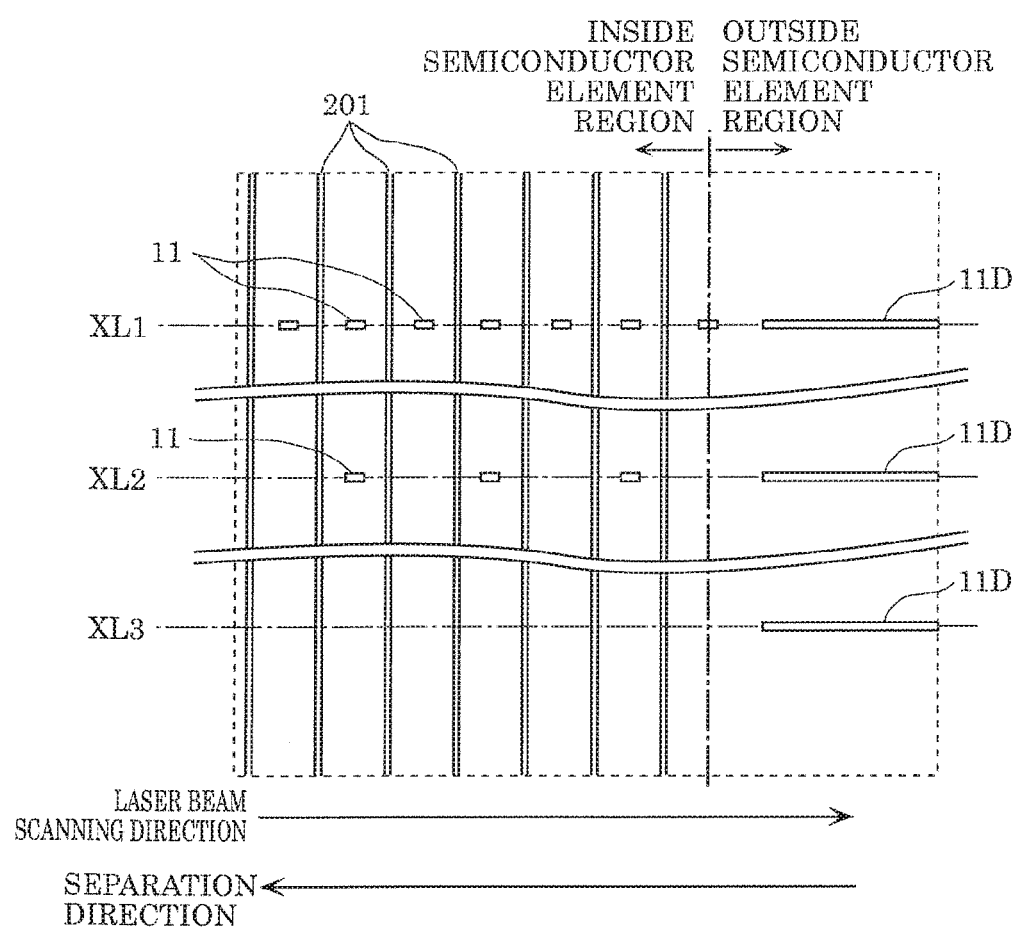
FIG. 24 is a plan view of variations of the first recesses formed outside a semiconductor element region of the semiconductor laser element substrate.

Moreover, in the above embodiment, first recess 11 is formed in the semiconductor element region in which element forming region 300 is formed. However, the present disclosure is not limited to such an example. For example, as illustrated in FIG. 24, first recess 11D may be formed outside the semiconductor element region positioned on the side opposite to the separating direction (the crack advancing direction). First recess 11D can be formed in the same manner as first recesses 11. In this case, first recess 11D formed outside the semiconductor element region may be longer than first recesses 11 formed inside the semiconductor element region. Accordingly, when semiconductor laser element substrate 2 is separated with first recess 11D as a starting point, the number of steps generated on the separated surface can be reduced. As an example, the length of first recess 11D is 200 μm to 1000 μm. When the length of first recess 11D is too short, the separating property is reduced. When the length of first recess 11D is too long, the area of the semiconductor element region is reduced and the number of semiconductor laser elements that can be manufactured is reduced. Moreover, when first recess 11D is formed outside the semiconductor element region, each first recess 11 may be formed inside the semiconductor element region and in each element forming region, as indicated by crosswise separation line XL1 in FIG. 24. It may also be that, as indicated by crosswise separation line XL2 in FIG. 24, first recess 11D is formed outside the semiconductor element region and thinned number of first recesses 11 is formed inside the semiconductor element region. It may also be that, as indicated by crosswise separation line XL3 in FIG. 24, only first recess 11D is formed outside the semiconductor element region without forming first recess 11 in the semiconductor element region.

Moreover, in the above described embodiment, each waveguide 201 is positioned closer to one of a pair of first trench 21 and second trench 22 instead of in the middle between first trench 21 and second trenches 22. However, waveguide 201 may be positioned in the middle between first trench 21 and second trench 22.

In the above embodiment, each waveguide 201 is a ridge with a tapered portion. However, waveguide 201 is not limited to such an example, and may be a ridge with the same width.

Other forms obtained by applying various modifications conceived by those skilled in the art to the embodiment and forms realized by arbitrarily combining the structural elements and functions of the embodiment without departing from the spirit of the present disclosure are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The technique according to the present disclosure is useful in, for example, a method of forming punctures on a sample, such as a semiconductor laser element substrate or a semiconductor element substrate, a method of separating the sample with the punctures, or a method of manufacturing a semiconductor laser element.

What is claimed is:

1. A puncture forming method of forming a puncture in a sample by irradiating a surface of the sample with a light beam, the puncture forming method comprising:
   forming a first puncture by irradiating a first position on the surface of the sample with a first pulse of the light beam; and
   forming a second puncture by irradiating a second position on the surface of the sample with a second pulse of the light beam after the forming of the first puncture, the second puncture at least partially overlapping the first puncture, the second position being positioned away from the first position in a first direction,
   wherein the second puncture has a tip positioned inside the sample, the tip being bent in a direction opposite to the first direction.

2. The puncture forming method according to claim 1, wherein the light beam is polarized in a direction perpendicular to the first direction.

3. The puncture forming method according to claim 1, wherein the light beam is a laser beam.

4. A semiconductor element manufacturing method of manufacturing a semiconductor element by separating a semiconductor element substrate, the semiconductor element manufacturing method comprising:
forming a first puncture by irradiating a first position on a surface of the semiconductor element substrate with a first pulse of a light beam;
forming a second puncture by irradiating a second position on the surface of semiconductor element substrate with a second pulse of the light beam after the forming of the first puncture, the second puncture at least partially overlapping the first puncture, the second position being positioned away from the first position in a first direction; and
separating the semiconductor element substrate along a recess after the forming of the second puncture, the recess being formed by the first puncture and the second puncture,
wherein the second puncture has a tip positioned inside the semiconductor element substrate, the tip being bent in a direction opposite to the first direction.

5. A sample separating method of separating a sample, the sample separating method comprising:
forming a recess in the sample; and
separating the sample along the recess,
wherein the recess includes a first region and a second region, the first region having a line shape along a first direction in a plan view of the sample and having a planar shape in a vertical cross-sectional view of the sample, the planar shape spreading to a plane defined by the first direction and a second direction which is a depth direction of the sample, the second region having a line shape extending from the first region in a direction opposite to the first direction.

6. A semiconductor element manufacturing method of manufacturing a semiconductor element by separating a semiconductor element substrate, the semiconductor element manufacturing method comprising:
forming a recess in the semiconductor element substrate; and
separating the semiconductor element substrate along the recess,
wherein the recess includes a first region and a second region, the first region having a line shape along a first direction in a plan view of the semiconductor element substrate and having a planar shape in a vertical cross-sectional view of the semiconductor element substrate, the planar shape spreading to a plane defined by the first direction and a second direction which is a depth direction of the semiconductor element substrate, the second region having a line shape extending from the first region in a direction opposite to the first direction.

7. A semiconductor laser element manufacturing method of manufacturing a semiconductor laser element by separating a semiconductor laser element substrate, the semiconductor laser element manufacturing method comprising:
forming a recess in the semiconductor laser element substrate; and
separating the semiconductor laser element substrate along the recess,
wherein the recess includes a first region and a second region, the first region having a line shape along a first direction in a plan view of the semiconductor laser element substrate and having a planar shape in a vertical cross-sectional view of the semiconductor laser element substrate, the planar shape spreading to a plane defined by the first direction and a second direction which is a depth direction of the semiconductor laser element substrate, the second region having a line shape extending from the first region in a direction opposite to the first direction.

8. The semiconductor laser element manufacturing method according to claim 7,
wherein the first region includes a side portion below an opening of the recess in the plan view of the semiconductor laser element substrate, and
the second region extends from the side portion.

9. The semiconductor laser element manufacturing method according to claim 7,
wherein, in the vertical cross-sectional view of the semiconductor laser element substrate, the first region has a cross-sectional shape which is one of a substantially triangular shape and a substantially trapezoidal shape having an upper base and a lower base shorter than the upper base, the upper base being a surface side of the semiconductor laser element substrate.

10. The semiconductor laser element manufacturing method according to claim 7,
wherein the recess includes a plurality of the second regions.

11. The semiconductor laser element manufacturing method according to claim 10,
wherein, in the vertical cross-sectional view of the semiconductor laser element substrate, among the plurality of the second regions, a second region positioned further from a surface of the semiconductor laser element substrate is longer than a second region positioned closer to the surface of the semiconductor laser element substrate.

12. The semiconductor laser element manufacturing method according to claim 7,
wherein the second region has a tip which is bent in a direction opposite to the first region.

13. The semiconductor laser element manufacturing method according to claim 7,
wherein, in the separating, the semiconductor laser element substrate is separated such that a crack advances from a first region side toward a second region side.

14. The semiconductor laser element manufacturing method according to claim 7,
wherein, when a direction perpendicular to both the first direction and the second direction is a third direction,
the second region has a tip which is bent in the third direction, and
a bending length of the second region in the third direction is less than a length of the second region in the first direction.

15. The semiconductor laser element manufacturing method according to claim 7,
wherein a length of the second region in the first direction is less than a length of the second region in the second direction.

16. The semiconductor laser element manufacturing method according to claim 15,
wherein, in the vertical cross-sectional view of the semiconductor laser element substrate, the first region includes a plurality of stripe portions extending from a surface of the semiconductor laser element substrate to an inner side of the semiconductor laser element substrate.

17. The semiconductor laser element manufacturing method according to claim 7,
wherein, in a side view of the semiconductor laser element substrate, after the separating, a separated surface of the semiconductor laser element substrate includes a step extending in a direction from the first region toward a back surface of the semiconductor laser element substrate and a step extending in a direction from the second region toward the back surface of the semiconductor laser element substrate.

18. The semiconductor laser element manufacturing method according to claim 17,
wherein a total number of steps extending from the first region excluding the second region is greater than a total number of steps extending from the second region.

19. The semiconductor laser element manufacturing method according to claim 7,
wherein, in the forming of the recess, the recess is formed between adjacent two of the plurality of waveguides.

20. A semiconductor laser element, comprising:
a step on at least one side surface of the semiconductor laser element,
wherein the step includes a first region and a second region, the first region having a planar shape which spreads to a plane defined by a first direction along a surface of the semiconductor laser element and a second direction which is a depth direction of the semiconductor laser element, the second region having a line shape extending from the first region in a direction opposite to the first direction.

* * * * *